United States Patent
Matsusue et al.

(10) Patent No.: US 9,780,321 B2
(45) Date of Patent: Oct. 3, 2017

(54) ORGANIC EL DISPLAY PANEL, DISPLAY DEVICE INCORPORATING SAME, AND ORGANIC EL DISPLAY PANEL MANUFACTURING METHOD

(71) Applicant: JOLED INC., Tokyo (JP)

(72) Inventors: Noriyuki Matsusue, Tokyo (JP); Kazuhiro Yoneda, Tokyo (JP); Minh Hiep Hoang, Kanagawa (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/125,346

(22) PCT Filed: Feb. 24, 2015

(86) PCT No.: PCT/JP2015/000924
§ 371 (c)(1),
(2) Date: Sep. 12, 2016

(87) PCT Pub. No.: WO2015/141143
PCT Pub. Date: Sep. 24, 2015

(65) Prior Publication Data
US 2017/0222173 A1   Aug. 3, 2017

(30) Foreign Application Priority Data
Mar. 20, 2014   (JP) ................... 2014-059041

(51) Int. Cl.
*H01L 27/32* (2006.01)
*H01L 51/50* (2006.01)
(Continued)

(52) U.S. Cl.
CPC ........ *H01L 51/5044* (2013.01); *H01L 27/322* (2013.01); *H01L 27/3213* (2013.01);
(Continued)

(58) Field of Classification Search
CPC . H01L 27/32; H01L 27/3206; H01L 27/3209; H01L 27/3211; H01L 27/322; H01L 27/3251; H01L 2227/32
See application file for complete search history.

(56) References Cited

U.S. PATENT DOCUMENTS

2003/0170491 A1   9/2003   Liao et al.
2003/0189401 A1   10/2003   Kido et al.
(Continued)

FOREIGN PATENT DOCUMENTS

JP   3884565   2/2007
JP   3933591   6/2007
(Continued)

OTHER PUBLICATIONS

U.S. Appl. No. 15/127,209 to Noriyuki Matsusue et al., filed Sep. 19, 2016.
(Continued)

*Primary Examiner* — Hoai V Pham
(74) *Attorney, Agent, or Firm* — Greenblum & Bernstein, P.L.C.

(57) ABSTRACT

An organic EL display panel includes light-reflective electrodes, a first red light-emitting layer, a green light-emitting layer, a first blue light-emitting layer, a second red light-emitting layer, a charge generating layer, a second blue light-emitting layer, and a light-transmissive electrode. In a red and a white sub-pixel region, a first optical length is from 20 nm to 50 nm, and a second optical length is from 210 nm to 230 nm. In a green sub-pixel region, the first optical length is from 20 nm to 50 nm, and the second optical length is from 240 nm to 295 nm. In a blue sub-pixel region, the first optical length is from 20 nm to 60 nm, and the second optical length is from 195 nm to 205 nm.

14 Claims, 18 Drawing Sheets

(51) Int. Cl.
  *H01L 51/52* (2006.01)
  *H01L 51/56* (2006.01)
(52) U.S. Cl.
  CPC ...... *H01L 27/3246* (2013.01); *H01L 51/5218* (2013.01); *H01L 51/5234* (2013.01); *H01L 51/56* (2013.01); *H01L 2251/5315* (2013.01)

(56) References Cited

U.S. PATENT DOCUMENTS

| | | |
|---|---|---|
| 2005/0029933 A1 | 2/2005 | Liao et al. |
| 2007/0182317 A1 | 8/2007 | Kido et al. |
| 2009/0242911 A1 | 10/2009 | Ishihara et al. |
| 2012/0132895 A1 | 5/2012 | Kido et al. |
| 2012/0248971 A1 | 10/2012 | Okuyama |
| 2013/0140533 A1 | 6/2013 | Lee et al. |
| 2014/0151648 A1 | 6/2014 | Kido |
| 2015/0249230 A1 | 9/2015 | Kido |

FOREIGN PATENT DOCUMENTS

| | | |
|---|---|---|
| JP | 2009-245747 | 10/2009 |
| JP | 4570014 | 10/2010 |
| JP | 2012-227118 | 11/2012 |
| JP | 2013-073759 | 4/2013 |

OTHER PUBLICATIONS

International Search Report (ISR) from International Searching Authority (Japan Patent Office) in International Pat. Appl. No. PCT/JP2015/000924, dated May 12, 2015.

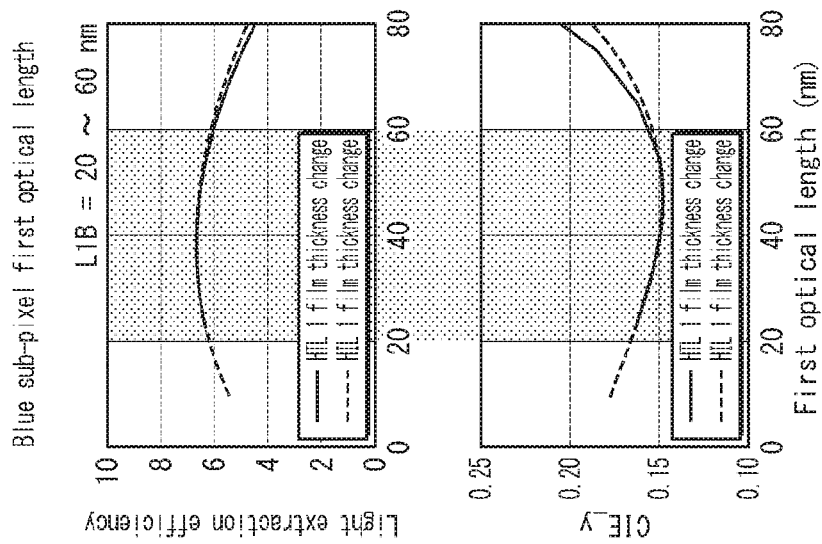
FIG. 3A  FIG. 3B  FIG. 3C
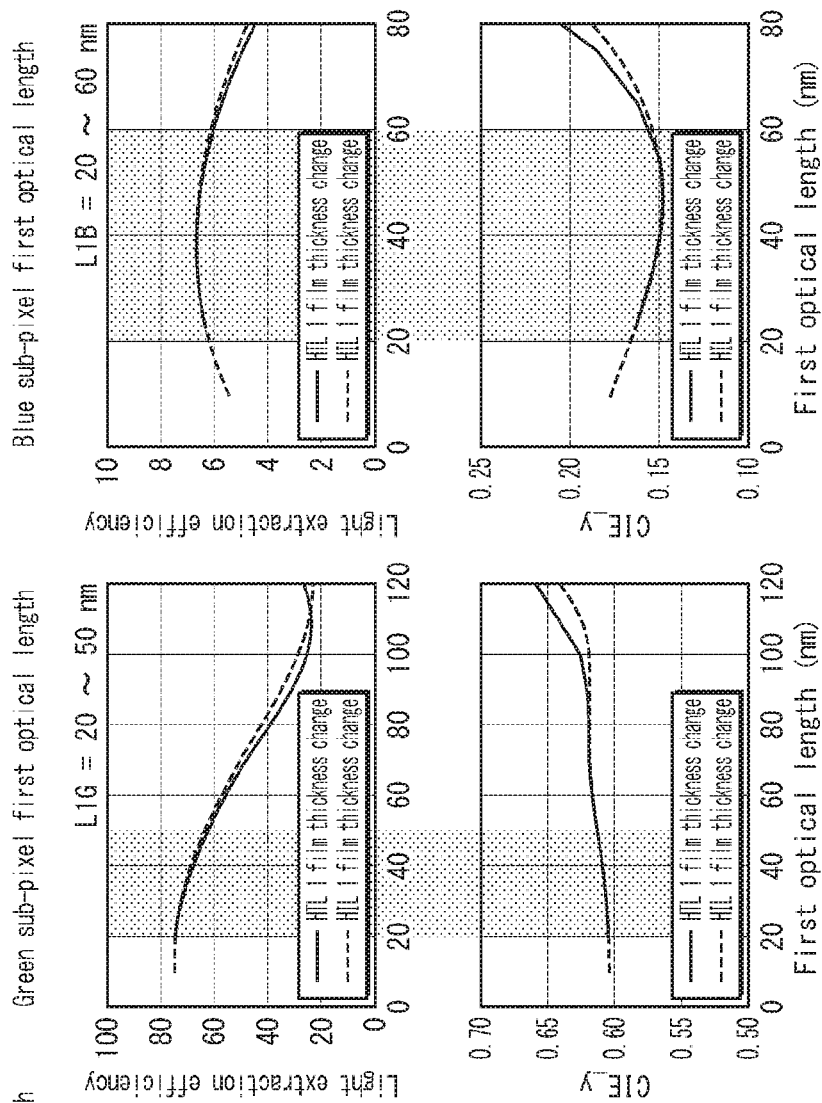
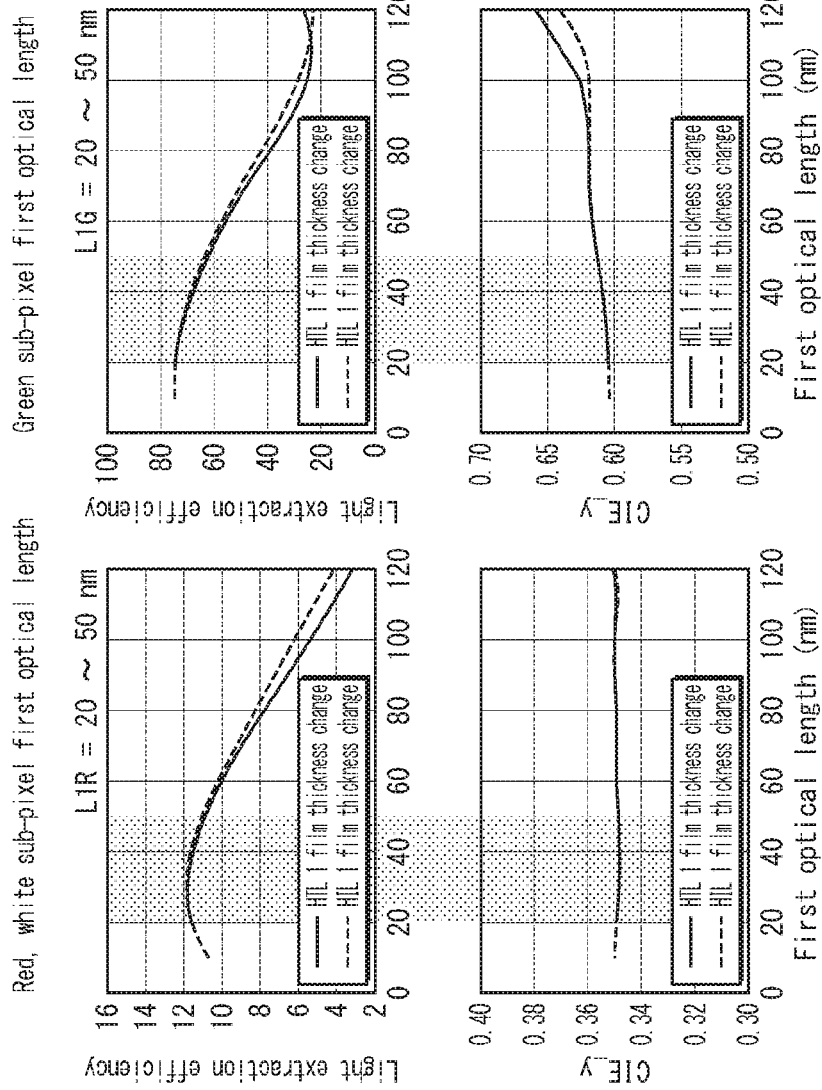

FIG. 5
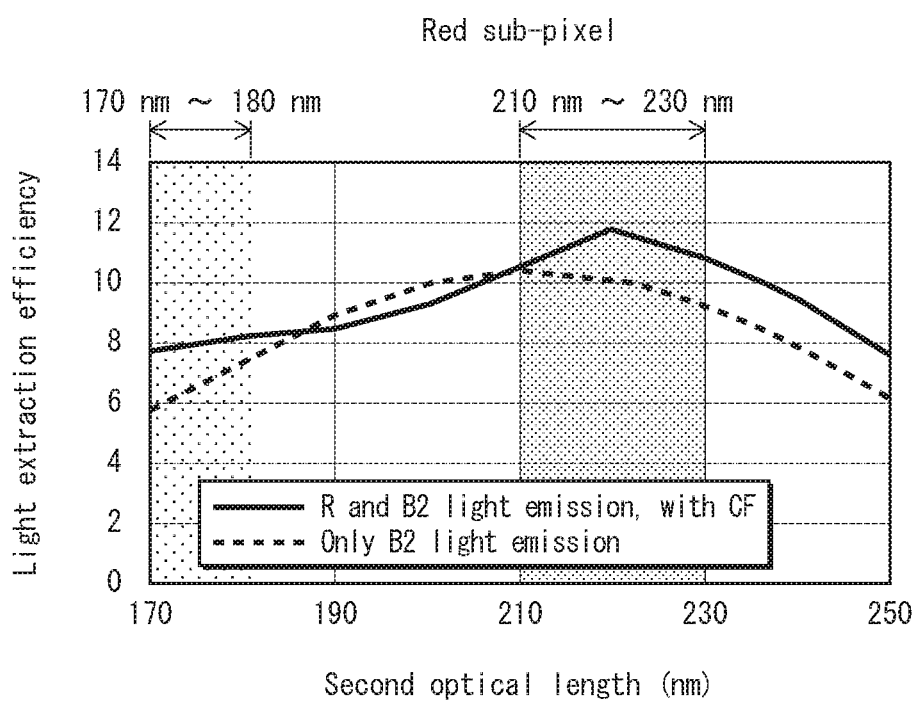
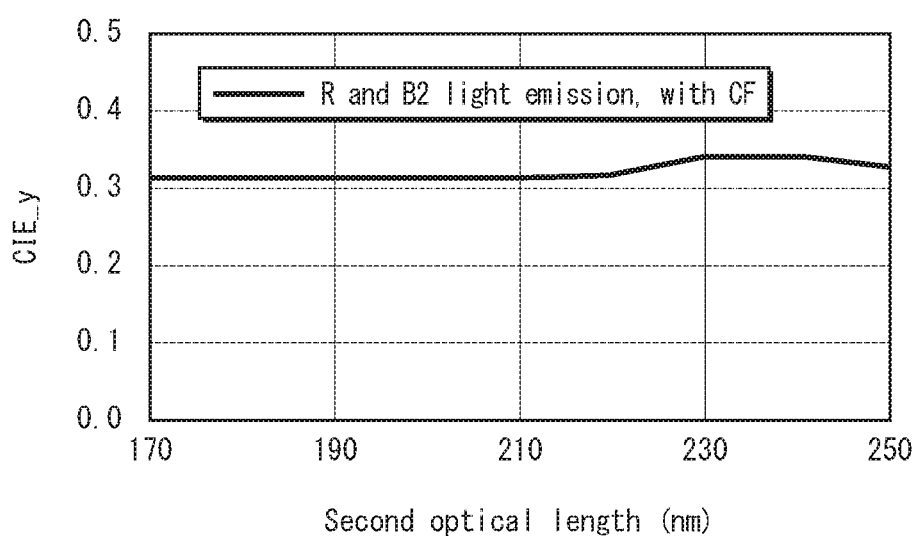
Second optical length (nm)

FIG. 6
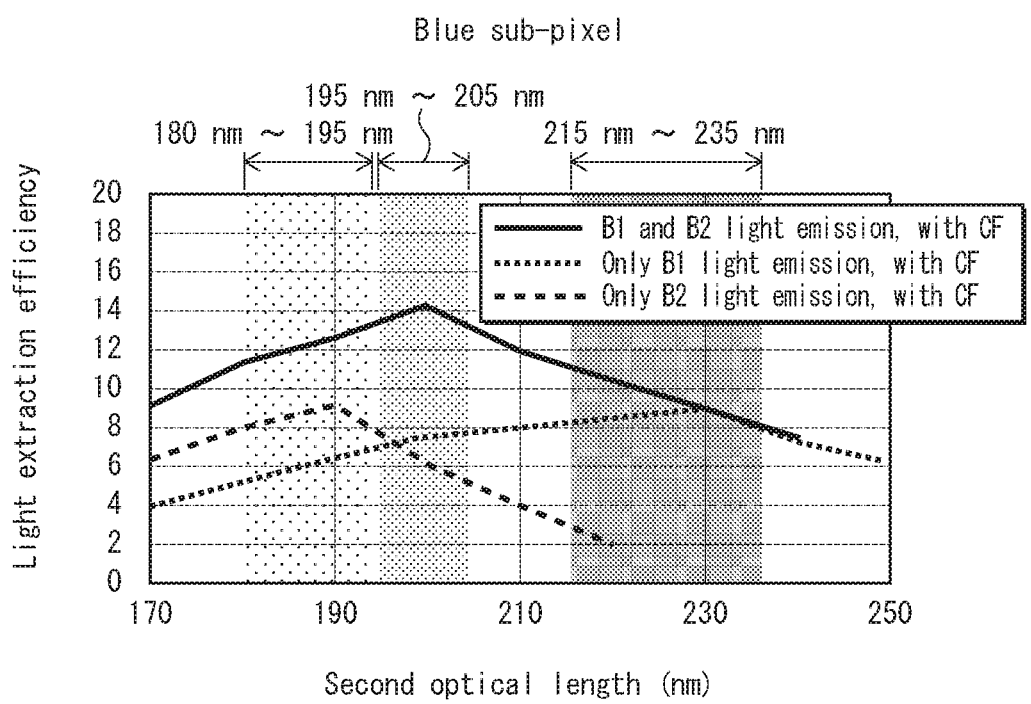
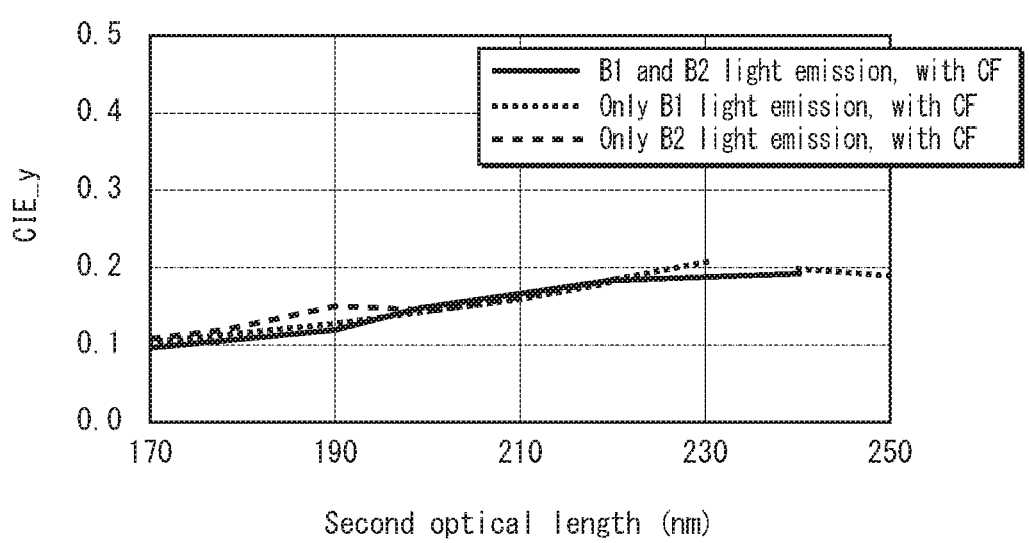

FIG. 14
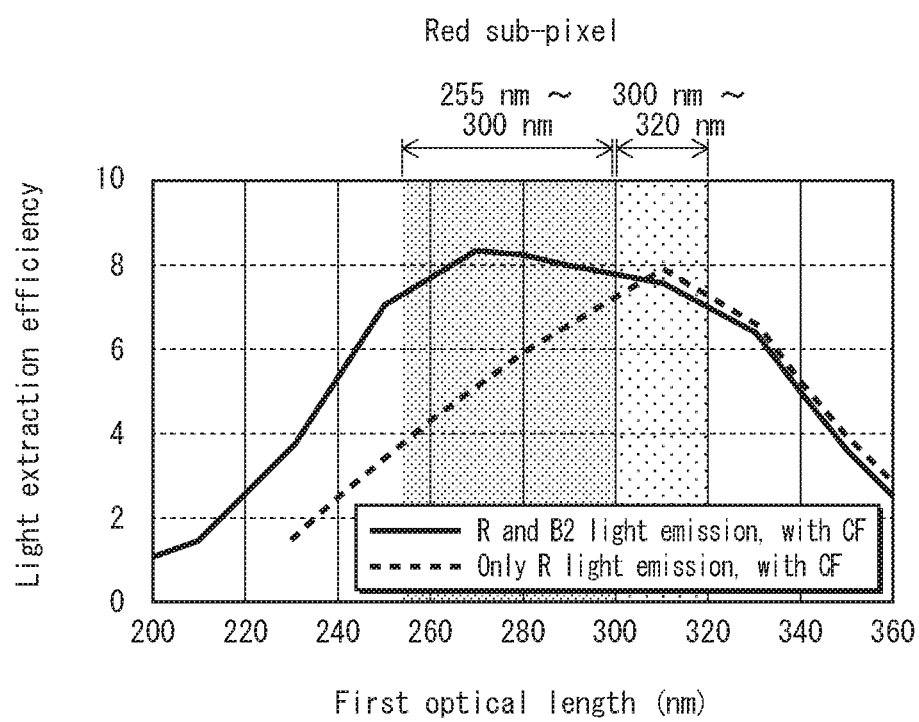
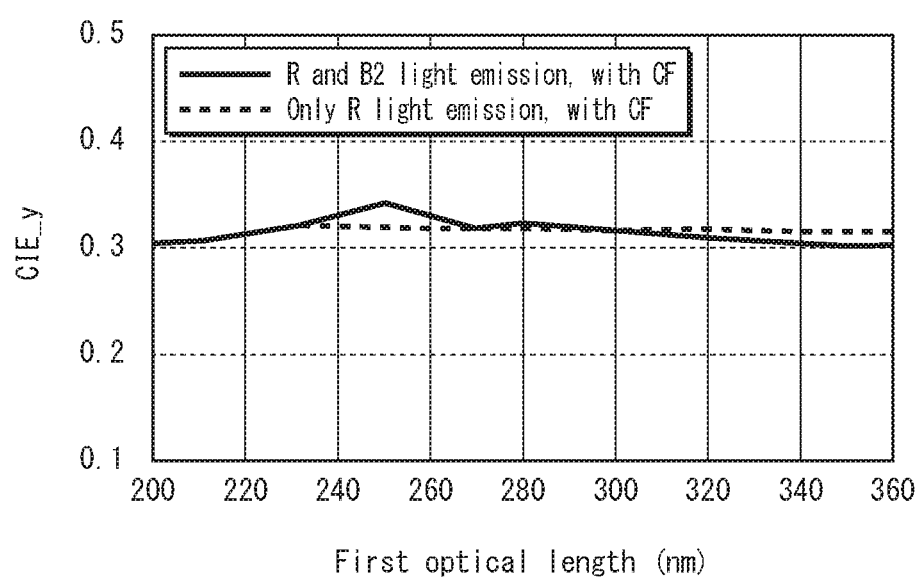

ORGANIC EL DISPLAY PANEL, DISPLAY DEVICE INCORPORATING SAME, AND ORGANIC EL DISPLAY PANEL MANUFACTURING METHOD

TECHNICAL FIELD

The present disclosure relates to organic electroluminescence (EL) display panels incorporating tandem-structure organic EL elements, display devices incorporating organic EL display panels, and organic EL display panel manufacturing methods.

BACKGROUND ART

In recent years, as display panels used in display devices such as digital televisions, organic electroluminescence (EL) display panels that use electroluminescence of organic materials are being implemented in which a plurality of organic EL elements are arrayed on a substrate.

As an organic EL display panel configuration, typically thin film transistor (TFT) drive circuitry is disposed on a substrate, an insulating layer is disposed on the TFT drive circuitry, and a plurality of organic EL elements are arrayed thereon. An organic EL element has, at minimum, a light-emitting layer sandwiched between a pair of electrodes (anode and cathode). Typically, an organic EL element has a hole injection layer and a hole transport layer between the anode and the light-emitting layer, and an electron injection layer and an electron transport layer between the cathode and the light-emitting layer. The hole injection layer, the hole transport layer, the electron injection layer, and the electron transport layer fulfil their respective specific functions of charge injection, charge transport, etc. In the present disclosure, such layers are referred to collectively as "functional layers". Such an organic EL element is a current-driven light-emitting element. When driven, a voltage is applied between the anode and the cathode, and light is emitted when holes and electrons injected into the light-emitting layer recombine.

In an organic EL display panel, such organic EL elements form sub-pixels in red, green, and blue colors, combinations of adjacent red, green, and blue sub-pixels forming pixels. In such an organic EL display panel, in order to reduce energy consumption and increase longevity, improving light emission efficiency and longevity of the organic EL elements for each of red, green, and blue colors are important. Among red, green, and blue colors of organic EL elements, lifespan of blue organic EL elements tends to be shortest, and therefore increasing longevity of blue organic EL elements is a technical problem for increasing longevity of display devices.

Patent Literature 1, 2, and 3 disclose implementing increased organic EL element longevity by adoption of an organic EL element structure in which a plurality of light-emitting units that include a light-emitting layer (a light-emitting unit being equivalent to a conventional organic light-emitting element without anode and cathode elements) are stacked (this may be referred to as a multiphoton structure, tandem structure, or stack structure, but this disclosure refers to a tandem structure). A tandem structure is a structure in which light-emitting units are stacked on both sides of a charge generating layer (a portion thereof in contact with a light-emitting unit may be referred to as a charge generating layer, an intermediate layer, an intermediate conductive layer, a connector, etc., but this disclosure refers to a charge generating layer). This charge generating layer supplies charge to the light-emitting units above and below it, and therefore light can be emitted from a plurality of light-emitting units in a tandem structure. As a result, light emitted from an organic EL element that has a tandem structure is a sum of light emitted from a plurality of light-emitting units, and therefore current required to obtain a desired luminance is decreased, and longevity of the current-driven type of organic EL element can be increased.

In order to adapt a tandem structure to an organic EL display panel, which light emission colors of light-emitting units to layer and how to layer them in red, green, and blue sub-pixels become important.

Resistance heating, coating application, printing, etc., are methods of film formation for light-emitting layers and functional layers made from organic light-emitting material. When vacuum deposition is used for film formation of light-emitting layers or functional layers of different sub-pixels, a precision shadow mask is typically used that is only open at sub-pixel regions. In such a case, material that forms light-emitting layers or functional layers attaches to portions of the shadow mask other than the openings, and this loss of material is a cause of increased manufacturing cost. Further, accurate alignment of openings of the precision shadow mask to sub-pixels is a factor lowering production efficiency, and in particular when producing large organic EL display panels the alignment of shadow mask to sub-pixels is very difficult.

Thus, from the perspectives of manufacturing costs and enlargement of an organic EL display panel, research is being actively pursued into film formation in which a low-molecular or high-molecular organic material is dissolved in solution or dispersed, and a light-emitting layer and functional layer including organic light-emitting material are formed by a wet process. However, there is a problem in that an organic EL element formed by using a wet process has a shorter lifespan that an organic EL element formed by using vacuum deposition.

Patent Literature 4 discloses a tandem structure in which blue light-emitting units are layered only in blue sub-pixels, in an organic EL display panel, by using a combination of wet and vacuum deposition processes. As a result, longevity and productivity of blue organic EL elements are improved, and manufacturing cost is decreased. More specifically, after forming a first red light-emitting unit including a red light-emitting layer, a first green light-emitting unit including a green light-emitting layer, and a first blue light-emitting unit including a first blue light-emitting layer by using wet processes, a charge generating layer is formed only in a blue sub-pixel region by using a vacuum deposition process. Subsequently, a second blue light-emitting unit including a second blue light-emitting layer is formed by using vacuum deposition so as to cover the first red light-emitting unit in a red sub-pixel, the first green light-emitting unit in a green sub-pixel, and the charge generating layer in the blue sub-pixel. Thus, there is no charge generating layer between the first red light-emitting unit and the second blue light-emitting unit, and the second blue light-emitting unit only has an electron transport function, and therefore light is not emitted from the second blue light-emitting unit in the red sub-pixel. The same is true for the green sub-pixel. According to this configuration, Patent Literature 4 discloses that longevity can be increased, manufacturing cost decreased, and productivity improved for a blue organic EL element.

CITATION LIST

Patent Literature

[Patent Literature 1] JP 3884565
[Patent Literature 2] JP 4570014
[Patent Literature 3] JP 3933591
[Patent Literature 4] JP 2013-73759

SUMMARY OF INVENTION

Technical Problem

However, use of a precision shadow mask is required to form a charge generating layer in only a blue sub-pixel, and a further improvement in productivity is desired. Furthermore, in red and green sub-pixels, the second blue light-emitting units only function for electron transport despite having light-emitting functionality, and an increase in drive voltage for the red and green organic EL elements is also a concern.

The technology pertaining to the present disclosure is achieved in view of the above circumstances, and aims to provide an organic EL display panel in which longevity of blue organic EL elements is improved, and which excels in terms of manufacturing cost and productivity, a display device that uses the organic EL display panel, and a method of manufacturing the organic EL display panel.

Solution to Problem

An organic EL display panel pertaining to one aspect of the technology of the present disclosure is an organic EL display panel comprising: a substrate; a plurality of banks, disposed above the substrate, that define a red sub-pixel region, a green sub-pixel region, a blue sub-pixel region, and a white sub-pixel region; a plurality of light-reflective electrodes, disposed above the substrate in the red sub-pixel region, the green sub-pixel region, the blue sub-pixel region, and the white sub-pixel region, each of the light-reflective electrodes having a light-reflective surface; a first red light-emitting unit disposed above a first one of the light-reflective electrodes in the red sub-pixel region, the first red light-emitting unit including a first red light-emitting layer comprising a material that has an emission peak in a red wavelength band, the first red light-emitting layer having a light-emitting surface that faces the light-reflective surface of the first one of the light-reflective electrodes; a first green light-emitting unit disposed above a second one of the light-reflective electrodes in the green sub-pixel region, the first green light-emitting unit including a green light-emitting layer comprising a material that has an emission peak in a green wavelength band, the green light-emitting layer having a light-emitting surface that faces the light-reflective surface of the second one of the light-reflective electrodes; a first blue light-emitting unit disposed above a third one of the light-reflective electrodes in the blue sub-pixel region, the first blue light-emitting unit including a first blue light-emitting layer comprising a material that has an emission peak in a blue wavelength band, the first blue light-emitting layer having a light-emitting surface that faces the light-reflective surface of the third one of the light-reflective electrodes; a second red light-emitting unit disposed above a fourth one of the light-reflective electrodes in the white sub-pixel region, the second red light-emitting unit including a second red light-emitting layer comprising a material that has an emission peak in a red wavelength band, the second red light-emitting layer having a light-emitting surface that faces the light-reflective surface of the fourth one of the light-reflective electrodes; a charge generating layer disposed above the first red light-emitting unit, the first green light-emitting unit, the first blue light-emitting unit, and the second red light-emitting unit in the red sub-pixel region, the green sub-pixel region, the blue sub-pixel region, and the white sub-pixel region; a second blue light-emitting unit disposed above the charge generating layer in the red sub-pixel region, the green sub-pixel region, the blue sub-pixel region, and the white sub-pixel region, the second blue light-emitting unit including a second blue light-emitting layer comprising a material that has an emission peak in a blue wavelength band, the second blue light-emitting layer having light-emitting surfaces that each face corresponding ones of the light-reflective surfaces of the light-reflective electrodes; a light-transmissive electrode disposed above the second blue light-emitting unit in the red, the green, the blue, and the white sub-pixel regions; and a color filter layer that includes a red filter disposed above the first one of the light-reflective electrodes in the red sub-pixel region, a green filter disposed above the second one of the light-reflective electrodes in the green sub-pixel region, and a blue filter disposed above the third one of the light-reflective electrodes in the blue sub-pixel region, wherein in the red sub-pixel region, an optical length between the light-emitting surface of the first red light-emitting layer and the light-reflective surface of the first one of the light-reflective electrodes is from 20 nm to 50 nm, in the green sub-pixel region, an optical length between the light-emitting surface of the green light-emitting layer and the light-reflective surface of the second one of the light-reflective electrodes is from 20 nm to 50 nm, in the blue sub-pixel region, an optical length between the light-emitting surface of the first blue light-emitting layer and the light-reflective surface of the third one of the light-reflective electrodes is from 20 nm to 60 nm, in the white sub-pixel region, an optical length between the light-emitting surface of the second red light-emitting layer and the light-reflective surface of the fourth one of the light-reflective electrodes is from 20 nm to 50 nm, in the red sub-pixel region, an optical length between one of the light-emitting surfaces of the second blue light-emitting layer and the light-reflective surface of the first one of the light-reflective electrodes is from 210 nm to 230 nm, in the green sub-pixel region, an optical length between one of the light-emitting surfaces of the second blue light-emitting layer and the light-reflective surface of the second one of the light-reflective electrodes is from 240 nm to 295 nm, in the blue sub-pixel region, an optical length between one of the light-emitting surfaces of the second blue light-emitting layer and the light-reflective surface of the third one of the light-reflective electrodes is from 195 nm to 205 nm, and in the white sub-pixel region, an optical length between one of the light-emitting surfaces of the second blue light-emitting layer and the light-reflective surface of the fourth one of the light-reflective electrodes is from 210 nm to 230 nm.

Advantageous Effects of the Invention

According to the organic EL display panel pertaining to one aspect of the present disclosure, the charge generating layer is present in the red sub-pixel region, the green sub-pixel region, the blue sub-pixel region, and the white sub-pixel region. Thus, the charge generating layer can be formed without using a precise shadow mask. Accordingly, manufacturing cost and productivity improvements can be made.

Further, optical lengths in the blue sub-pixel region are within the ranges stated above, and therefore blue light emitted from both the first blue light-emitting layer and the second blue light-emitting layer can be efficiently extracted. Accordingly, current required to obtain a desired luminance is decreased, and therefore lifespan of current-driven organic EL elements can be increased.

Further, optical lengths in the red sub-pixel region are within the ranges stated above, and therefore light extraction efficiency of red light emitted from the first red light-emitting layer in the red sub-pixel region is improved, while suppressing light extraction efficiency of blue light emitted from the second blue light-emitting layer. In the red sub-pixel region, light extraction efficiency of unwanted blue light is suppressed, and therefore a decrease in red color purity is suppressed.

Further, optical lengths in the green sub-pixel region are within the ranges stated above, and therefore light extraction efficiency of green light emitted from the green light-emitting layer in the green sub-pixel region is improved, while suppressing light extraction efficiency of blue light emitted from the second blue light-emitting layer. In the green sub-pixel region, light extraction efficiency of unwanted blue light is suppressed, and therefore a decrease in green color purity is suppressed.

Further, optical lengths in the white sub-pixel region are within the ranges stated above, and therefore light extraction efficiency of a mix of light emitted from the second red light-emitting layer and light emitted from the second blue light-emitting layer is improved, while bringing the color of the mix of light closer to white light.

BRIEF DESCRIPTION OF DRAWINGS

FIG. 3A, FIG. 3B, and FIG. 3C illustrate changes in light extraction efficiency and chromaticity of light emitted from an organic EL element with respect to first optical lengths.

FIG. 5 illustrates a more detailed simulation with respect to red sub-pixels.

FIG. 6 illustrates a more detailed simulation with respect to blue sub-pixels.

FIG. 14 illustrates a more detailed simulation with respect to red sub-pixels.

EMBODIMENTS

The following illustrates specific examples, and describes configurations, operations, and effects related thereto.

The embodiments described below are illustrative examples used to better describe configurations, operations, and effects of an aspect of the present invention, and aside from essential elements thereof, the present invention is not limited to the following examples.

<Embodiments>

[1. Configuration of Organic EL Display Panel (Top-emission)]

Figure 1:
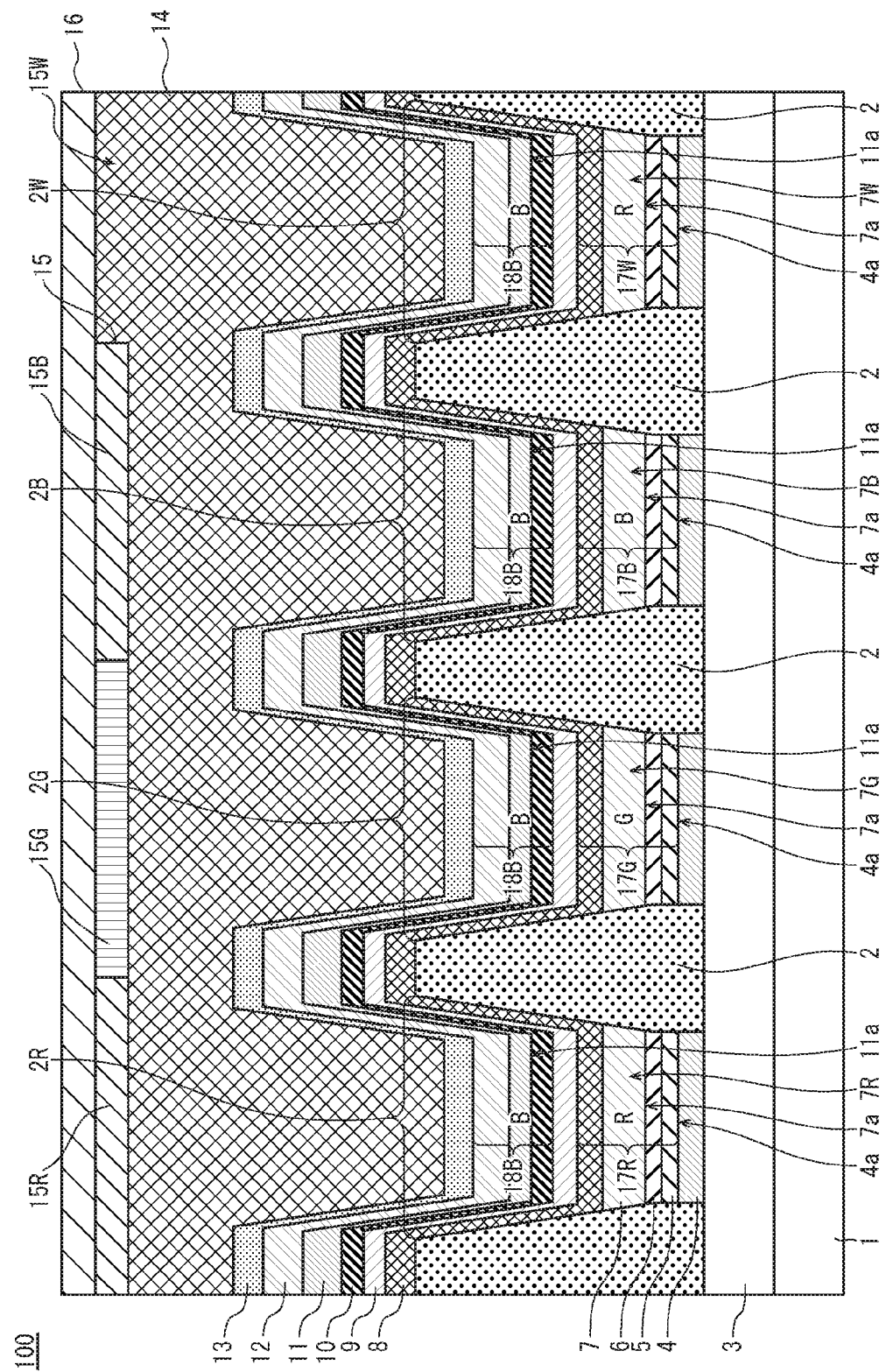
FIG. 1 is a cross-section enlargement of a pixel of an organic EL display panel pertaining to Embodiment 1.

A configuration of an organic EL display panel pertaining to Embodiment 1 of the present disclosure is described below, with reference to FIG. 1. FIG. 1 is a cross-section enlargement of a pixel of an organic EL display panel pertaining to Embodiment 1 of the present disclosure. According to the present embodiment, an organic EL display panel 100 is a so-called "top-emission" type, in which a display surface thereof is towards the upper side of FIG. 1.

The organic EL display panel 100 includes a first substrate 1, banks 2, an insulating layer 3, light-reflective electrodes 4, first hole injection layers 5, first hole transport layers 6, a first red light-emitting layer 7R, a green light-emitting layer 7G, a first blue light-emitting layer 7B, a second red light-emitting layer 7W, a first electron transport layer 8, a charge generating layer 9, a second hole transport layer 10, a second blue light-emitting layer 11, a second electron transport layer 12, a light-transmissive electrode 13, a protective layer 14, a color filter layer 15, and a second substrate 16.

The first substrate 1 is, for example, a TFT substrate including an electrically-insulative base material and a TFT layer disposed on the base material. The TFT layer includes a plurality of TFT drive circuits, and a plurality of wires that supply external power to the TFT drive circuits.

The insulating layer 3 is disposed on the first substrate 1. A upper surface of the insulating layer 3 is planarized.

The banks 2 are disposed on the insulating layer 3, separated from each other. The banks 2 define a red sub-pixel region 2R, a green sub-pixel region 2G, a blue sub-pixel region 2B, and a white sub-pixel region 2W.

The reflective electrodes 4 are disposed on the insulating layer 3, separated from each other. The insulating layer 3 has a plurality of contact holes (not illustrated). Wiring is buried in each of the contact holes (not illustrated). Each of the reflective electrodes 4 is electrically connected to a corresponding one of the TFT drive circuits in the first substrate 1 via wiring buried in a corresponding one of the contact holes. According to the present embodiment, the light-reflective electrodes 4 function as anodes supplying holes to the first hole injection layers 5.

In the red sub-pixel region 2R, one of the first hole injection layers 5, one of the first hole transport layers 6, and the first red light-emitting layer 7R are layered in this order on one of the light-reflective electrodes 4. In the green sub-pixel region 2G, one of the first hole injection layers 5, one of the first hole transport layers 6, and the green light-emitting layer 7G are layered in this order on one of the light-reflective electrodes 4. In the blue sub-pixel region 2B, one of the first hole injection layers 5, one of the first hole transport layers 6, and the first blue light-emitting layer 7B are layered in this order on one of the light-reflective electrodes 4. In the white sub-pixel region 2W, one of the first hole injection layers 5, one of the first hole transport layers 6, and the second red light-emitting layer 7W are layered in this order on one of the light-reflective electrodes 4. Hereinafter, when the first red light-emitting layer 7R, the green light-emitting layer 7G, the first blue light-emitting layer 7B, and the second red light-emitting layer 7W are not differentiated, they are referred to as "first light-emitting layers 7".

The first hole injection layers 5 have a function of promoting injection of holes from the light-reflective electrodes 4 to the first hole transport layers 6 and the first light-emitting layers 7. The first hole injection layers 5 in the sub-pixel regions may be separated from each other by the banks 2, or may be connected to each other across the banks 2. When separated by the banks 2, the first hole injection layers 5 may be the same thickness as each other or different thicknesses from each other, and the first hole injection layers 5 may be the same material as each other or different materials from each other. When connected to each other across the banks 2, the first hole injection layers 5 may be connected across bottom surfaces of the banks 2 by being formed before the banks 2 are formed, or may be connected across top surfaces of the banks 2 by being formed after the banks 2 are formed.

The first hole transport layers 6 have functions of promoting hole injection from the first hole injection layers 5 to the first light-emitting layers 7 and blocking escape of electrons and exciton energy from the first light-emitting layers 7. The first hole transport layers 6 in the sub-pixel regions may be separated from each other by the banks 2, or may be connected to each other across the banks 2. When separated by the banks 2, the first hole transport layers 6 may be the same thickness as each other or different thicknesses from each other, and the first hole transport layers 6 may be the same material as each other or different materials from each other. When connected to each other across the banks 2, the first hole transport layers 6 may be connected across bottom surfaces of the banks 2 by being formed before the banks 2 are formed, or may be connected across top surfaces of the banks 2 by being formed after the banks 2 are formed. The first hole injection layers 5 and the first hole transport layers 6 may be formed as a single layer, and additional layers may be added.

The first light-emitting layers 7 have a function of emitting light according to recombination of holes and electrons. The first red light-emitting layer 7R, the green light-emitting layer 7G, the first blue light-emitting layer 7B, and the second red light-emitting layer 7W are separated from each other by the banks 2. The first red light-emitting layer 7R includes a material that has a light emission peak in a red wavelength band. The green light-emitting layer 7G includes a material that has a light emission peak in a green wavelength band. The first blue light-emitting layer 7B includes a material that has a light emission peak in a blue wavelength band. The second red light-emitting layer 7W includes a material that has a light emission peak in a red wavelength band. The first red light-emitting layer 7R, the green light-emitting layer 7G, the first blue-light-emitting layer 7B, and the second red light-emitting layer 7W may have the same thickness as each other or may have different thicknesses to each other.

The first electron transport layer 8 includes portions disposed on the first light-emitting layers 7 in the red sub-pixel region 2R, the green sub-pixel region 2G, the blue sub-pixel region 2B, and the white sub-pixel region 2W. The portions are connected to each other over the banks 2. The first electron transport layer 8 has a function of transporting electrons supplied from the charge generating layer 9 to the first light-emitting layers 7. The first electron transport layer 8 may be formed from a plurality of layers.

The charge generating layer 9 includes portions disposed on the first electron transport layer 8 in the red sub-pixel region 2R, the green sub-pixel region 2G, the blue sub-pixel region 2B, and the white sub-pixel region 2W. The portions are connected to each other over the banks 2. The charge generating layer 9 has functions of supplying electrons to the first electron transport layer 8 and supplying holes to the second hole transport layer 10. The charge generating layer 9 may be formed from a plurality of layers.

In the red sub-pixel region 2R, the green sub-pixel region 2G, the blue sub-pixel region 2B, and the white sub-pixel region 2W, the second hole transport layer 10, the second blue light-emitting layer 11, and the second electron transport layer 12 are layered on the charge generating layer 9 in this order. The second hole transport layer 10 has functions of transporting holes supplied from the charge generating layer 9 to the second blue light-emitting layer 11 and of blocking escape of electrons and exciton energy from the second blue light-emitting layer 11. The second blue light-emitting layer 11 has a function of emitting light according to recombination of holes and electrons. The second blue light-emitting layer 11 includes a material that has a light emission peak in a blue wavelength band. The second electron transport layer 12 has a function of transporting electrons supplied from the light-transmissive electrode 13 to the second blue light-emitting layer 11. The second hole transport layer 10 and the second electron transport layer 12 may be formed from a plurality of layers.

The light-transmissive electrode 13 includes portions disposed on the second electron transport layer 12 in the red sub-pixel region 2R, the green sub-pixel region 2G, the blue sub-pixel region 2B, and the white sub-pixel region 2W. The portions are connected to each other over the banks 2. According to the present embodiment, the light-transmissive electrode 13 functions as a cathode supplying electrons to the second electron transport layer 12. The light-transmissive electrode 13 may be formed from a plurality of layers.

The protective layer 14 is disposed on the light-transmissive electrode 13. The protective layer 14 has a function of protecting the layers, from the light-reflective electrodes 4 to the light-transmissive electrode, 13 from moisture and oxygen.

The color filter layer 15 is disposed on the protective layer 14. The color filter layer 15 includes a red filter 15R, a green filter 15G, and a blue filter 15B. The red filter 15R is positioned above the red sub-pixel region 2R. The green filter 15G is positioned above the green sub-pixel region 2G. The blue filter 15B is positioned above the blue sub-pixel region 2B. There is no filter above the white sub-pixel region 2W in a region 15W in which filters are present in other sub-pixel regions. The color filter layer 15 has a function of correcting chromaticity of emitted light.

The second substrate 16 is disposed on the color filter layer 15.

A first red light-emitting unit 17R comprises one of the first hole injection layers 5, one of the first hole transport layers 6, the first red light-emitting layer 7R, and the first electron transport layer 8, all in the red sub-pixel region 2R. A first green light-emitting unit 17G comprises one of the first hole injection layers 5, one of the first hole transport layers 6, the green light-emitting layer 7G, and the first electron transport layer 8, all in the green sub-pixel region 2G. A first blue light-emitting unit 17B comprises one of the first hole injection layers 5, one of the first hole transport layers 6, the first blue light-emitting layer 7B, and the first electron transport layer 8, all in the blue sub-pixel region 2B. A second red light-emitting unit 17W comprises one of the first hole injection layers 5, one of the first hole transport layers 6, the second red light-emitting layer 7W, and the first electron transport layer 8, all in the white sub-pixel region 2W.

A second blue light-emitting unit 18B comprises the second hole transport layer 10, the second blue light-emitting layer 11, and the second electron transport layer 12, in the red sub-pixel region 2R, the green sub-pixel region 2G, the blue sub-pixel region 2B, and the white sub-pixel region 2W.

As above, in the red sub-pixel region 2R, the charge generating layer 9 is layered between the first red light-emitting unit 17R and the second blue light-emitting unit 18B. In the green sub-pixel region 2G, the charge generating layer 9 is layered between the first green light-emitting unit 17G and the second blue light-emitting unit 18B. In the blue sub-pixel region 2B, the charge generating layer 9 is layered between the first blue light-emitting unit 17B and the second blue light-emitting unit 18B. In the white sub-pixel region 2W, the charge generating layer 9 is layered between the second red light-emitting unit 17W and the second blue light-emitting unit 18B. Accordingly, it can be said that tandem-type organic EL elements are in the red sub-pixel region 2R, the green sub-pixel region 2G, the blue sub-pixel region 2B, and the white sub-pixel region 2W.

[2. Optical Design (Top-emission)]

According to the present embodiment, the charge generating layer 9 and the second blue light-emitting layer 11 are disposed in the red sub-pixel region 2R, the green sub-pixel region 2G, the blue sub-pixel region 2B, and the white sub-pixel region 2W. Thus, not only the organic EL elements in the blue sub-pixel region 2B and the white sub-pixel region 2W, but also the organic EL elements in the red sub-pixel region 2R and the in the green sub-pixel region 2G emit blue light. However, for example, for the organic EL element in the red sub-pixel region, blue light is unnecessary; if blue light were emitted externally unaltered, chromaticity of light emitted from the red sub-pixel region 2R would be adversely affected. Thus, on a side of the organic EL element from which light is emitted, a red filter is preferably provided that changes chromaticity of emitted light to red.

However, in order to increase light extraction efficiency (ratio of light emitted internally to light outputted), it is necessary to reduce an amount of light absorbed by the red filter, from light emitted by the organic EL element in the red sub-pixel region. Conventionally, a known technique for improving light extraction efficiency of an organic EL element is appropriately designing thickness and refractive index of each layer of the organic EL element, appropriately adjusting microcavity structures of the organic EL element. Typically, light extraction efficiency is improved for one of red light, green light, and blue light, or for two or more colors of emitted light intended to produce white light.

According to the structure of the organic EL elements of the present embodiment, the second blue light-emitting layer 11 in the red sub-pixel region 2R, the green sub-pixel region 2G, the blue sub-pixel region 2B, and the white sub-pixel region 2W emits blue light. Thus, in the blue sub-pixel region 2B, it is preferable to increase light extraction efficiency for both blue light emitted by the first blue light-emitting layer 7B and blue light emitted by the second blue light-emitting layer 11. In contrast, in the green sub-pixel region 2G, it is preferable to increase light extraction efficiency for green light emitted by the green light-emitting layer 7G and decrease light extraction efficiency for blue light emitted by the second blue light-emitting layer 11. In the red sub-pixel region 2R, it is preferable to increase light extraction efficiency for red light emitted by the first red light-emitting layer 7R and decrease light extraction efficiency for blue light emitted by the second blue light-emitting layer 11. In the white sub-pixel region 2W, it is preferable to increase light extraction efficiency for the mix of red light emitted by the second red light-emitting layer 7W and blue light emitted by the second blue light-emitting layer 11, and to make the chromaticity of the mix of light closer to white light. In other words, because desired chromaticity of emitted light is different for each sub-pixel, a design is required that controls light extraction efficiency appropriately for the organic EL elements the red sub-pixel region 2R, the green sub-pixel region 2G, the blue sub-pixel region 2B, and the white sub-pixel region 2W. In particular, a design is required, for the organic EL elements in the red sub-pixel region 2R and the green sub-pixel region 2G, that can simultaneously improve light extraction efficiency and decrease light extraction efficiency.

Figure 2:
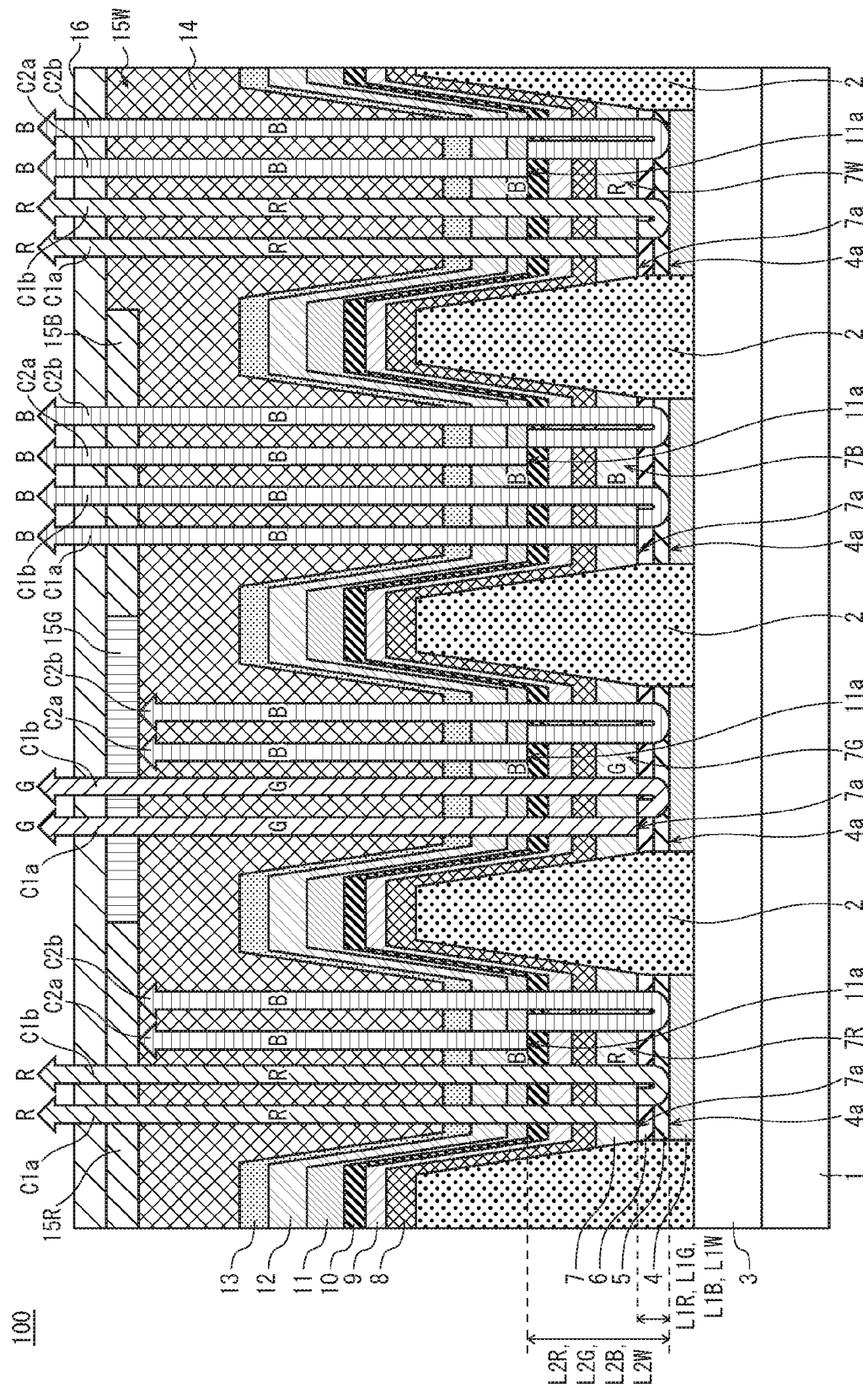
FIG. 2 illustrates light paths of light emitted from organic EL elements pertaining to Embodiment 1.

FIG. 2 illustrates optical paths of light emitted from the organic EL elements in sub-pixel regions.

An optical path C1$a$ is an optical path of light travelling from one of the first light-emitting layers 7, towards the light-transmissive electrode 13, without travelling towards the light-reflective electrodes 4. An optical path C1$b$ is an optical path of light travelling from one of the first light-emitting layers 7 towards the light-reflective electrodes 4, being reflected at one of the light-reflective electrodes 4, and subsequently travelling towards the light-transmissive electrode 13. An optical path C2$a$ is an optical path of light travelling from the second blue light-emitting layer 11, towards the light-transmissive electrode 13, without travelling towards the light-reflective electrodes 4. An optical path C2$b$ is an optical path of light travelling from the second blue light-emitting layer 11 towards the light-reflective electrodes 4, being reflected at one of the light-reflective electrodes 4, and subsequently travelling towards the light-transmissive electrode 13.

As stated above, the first hole transport layers 6 have the function of blocking escape of electrons from the first light-emitting layers 7. Thus, electrons in the first light-emitting layers 7 tend to accumulate in the vicinity of interfaces between the first light-emitting layers 7 and the first hole transport layers 6 (bottom surfaces of the first light-emitting layers 7). Recombination of electrons and holes tends to occur in the vicinity of the bottom surfaces of the first light-emitting layers 7, and therefore light emission intensity is greater in the vicinity of the bottom surfaces of the first light-emitting layers 7. According to the present embodiment, the bottom surfaces of the first light-emitting layers 7 are referred to as light-emitting surfaces 7$a$ of the first light-emitting layers 7. Similarly, a bottom surface of the second blue light-emitting layer 11 is referred to as a light-emitting surface 11$a$ of the second blue light-emitting layer 11. When designing microcavity structure of an organic EL element, it is sufficient to consider optical lengths L1R, L1G, L1B, L1W (hereinafter, "first optical lengths") between the light-emitting surfaces 7$a$ of the first light-emitting layers 7 and light reflecting surfaces 4$a$ of the light-reflective electrodes 4 and optical lengths L2R, L2G, L2B, L2W (hereinafter, "second optical lengths") between the light-emitting surfaces 11$a$ of the second blue light-emitting layer 11 and the light reflecting surfaces 4$a$ of the light-reflective electrodes 4.

According to the present embodiment, the bottom surfaces of the first light-emitting layers 7 are light-emitting surfaces of the first light-emitting layers 7, but this is just an example. As another example, as long as the first electron transport layer 8 has a function of blocking the escape of holes from the first light-emitting layers 7 in addition to the function of injecting electrons into the first light-emitting layers 7, upper surfaces of the first light-emitting layers 7 may be light-emitting surfaces of the first light-emitting layers 7. This also applies to the second blue light-emitting layer 11.

[3. First Optical Lengths (Top-emission)]

FIG. 3A, FIG. 3B, and FIG. 3C show optical simulation results, and indicate changes in light extraction efficiency and chromaticity of organic EL elements with respect to first optical lengths. FIG. 3A indicates a red and white sub-pixel, FIG. 3B indicates a green sub-pixel, and FIG. 3C indicates a blue sub-pixel. Here, y values are values in CIE chromaticity coordinates. Typically, optical length is a physical amount equal to the product of film thickness of layers and their refractive indices, but according to the present embodiment, optical length is indicated as film thickness of layers. Light extraction efficiency indicates a value prior to light absorption by the color filter layer, i.e., a value of light emitted from a first light-emitting layer. Base values for film thickness of each layer were set as follows:

Light-reflective electrode: 200 nm (silver alloy)
First hole injection layer: 20 nm (electrically conductive polymer material)
First hole transport layer: 10 nm (amine compound)
First light-emitting layer: 50 nm (polyfluorene derivative)
First electron transport layer: 35 nm (phenanthroline derivative)
Charge generating layer: 10 nm (HAT-CN6)
Second hole transport layer: 30 nm (amine compound)
Second blue light-emitting layer: 25 nm (anthracene compound)
Second electron transport layer: 35 nm (phenanthroline derivative)
Light-transmissive electrode: 35 nm (ITO)

Refractive indices of the materials were evaluated by spectroscopic ellipsometry.

According to the present embodiment, first optical lengths are represented by the sum of film thicknesses of the first hole injection layer and the first hole transport layer. FIG. 3A, FIG. 3B, and FIG. 3C show cases in which film thicknesses of the first hole injection layers are varied (dashed lines) and cases in which film thicknesses of the first hole transport layers are varied (solid lines). Because both materials are organic materials, they have substantially the same refractive indices. Thus, it can be seen that changes in either film thickness shows the same trends. In other words, film thickness of any layer between the light reflecting surfaces of light-reflective electrodes and light-emitting surfaces of the first light-emitting layers may be adjusted, and a layer such as a hole injection layer and a hole transport layer may be added.

In FIG. 3A, the organic EL element in the red and white sub-pixel region has a peak light extraction efficiency when the first optical length is approximately 30 nm. When the first optical length is equal to or less than 50 nm, peak values of light extraction efficiency equal to or greater than 90% can be ensured. In order to express the functions of hole injection and hole transport of the first hole injection layer and the first hole transport layer, the first optical length is preferably equal to or greater than 20 nm. Accordingly, the organic EL element in the red and white sub-pixel region preferably has the first optical length set from 20 nm to 50 nm.

In FIG. 3B, the organic EL element in the green sub-pixel region has a peak light extraction efficiency when the first optical length is approximately 10 nm. When the first optical length is equal to or less than 50 nm, peak values of light extraction efficiency equal to or greater than 90% can be ensured. For the same reasons as with the red sub-pixel region, the first optical length is preferably equal to or greater than 20 nm. Accordingly, the organic EL element in the green sub-pixel region preferably has the first optical length set from 20 nm to 50 nm.

In FIG. 3C, the organic EL element in the blue sub-pixel region has a peak light extraction efficiency when the first optical length is approximately 40 nm. When the first optical length is equal to or less than 60 nm, peak values of light extraction efficiency equal to or greater than 90% can be ensured. For the same reasons as with the red sub-pixel region, the first optical length is preferably equal to or greater than 20 nm. Accordingly, the organic EL element in the blue sub-pixel region preferably has the first optical length set from 20 nm to 60 nm.

[4. Second Optical Lengths (Top-emission)]

Figure 4A:
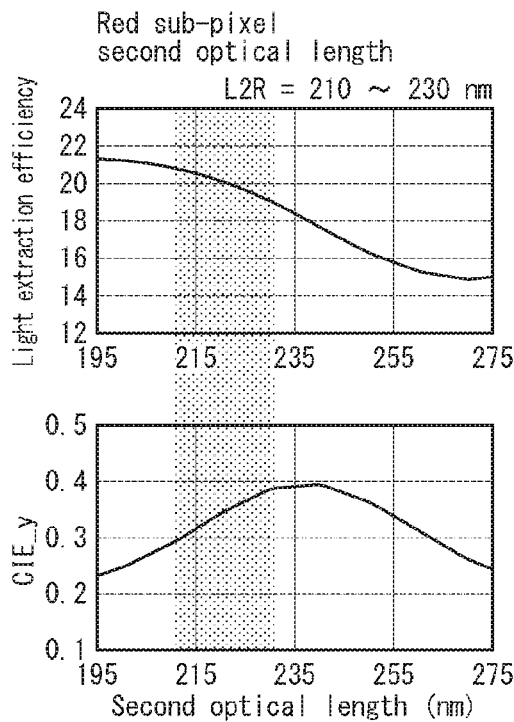
FIG. 4A, FIG. 4B, FIG. 4C, and FIG. 4D illustrate changes in light extraction efficiency and chromaticity of light emitted from an organic EL element with respect to second optical lengths.

FIG. 4A, FIG. 4B, FIG. 4C, and FIG. 4D show optical simulation results, and indicate changes in light extraction efficiency and chromaticity of organic EL elements with respect to second optical lengths. FIG. 4A indicates a red sub-pixel, FIG. 4B indicates a green sub-pixel, FIG. 4C indicates a blue sub-pixel, and FIG. 4D indicates a white sub-pixel. Light extraction efficiency indicates a value prior to light absorption by the color filter layer, i.e., a value with respect to the sum of light emitted from a first light-emitting layer and light emitted from the second blue light-emitting layer. Base values for film thickness of each layer were set as follows:

Light-reflective electrode: 200 nm (silver alloy)
First hole injection layer: 20 nm (electrically conductive polymer material)
First hole transport layer: 10 nm (amine compound)
First light-emitting layer: 50 nm (polyfluorene derivative)
First electron transport layer: 35 nm (phenanthroline derivative)
Charge generating layer: 10 nm (HAT-CN6)
Second hole transport layer: 30 nm (amine compound)
Second blue light-emitting layer: 25 nm (anthracene compound)
Second electron transport layer: 35 nm (phenanthroline derivative)
Light-transmissive electrode: 35 nm (ITO)

Refractive indices of the materials were evaluated by spectroscopic ellipsometry.

According to the present embodiment, the second optical lengths are represented by the sum of film thicknesses of the first hole injection layer, the first hole transport layer, the first light-emitting layer, the first electron transport layer, the charge generating layer, and the second hole transport layer. FIG. 4A, FIG. 4B, FIG. 4C, and FIG. 4D show cases in which film thicknesses of the second hole transport layer are changed.

In FIG. 4A, the organic EL element in the red sub-pixel region has a peak light extraction efficiency when the second optical length is approximately 195 nm. When the second optical length is from 160 nm to 230 nm, peak values of light extraction efficiency equal to or greater than 90% can be ensured. Note that results around 160 nm are not shown in FIG. 4A. On the other hand, when the second optical length is from 210 nm to 265 nm, a y value in an appropriate range for the red sub-pixel (equal to or greater than 0.30) can be ensured. Accordingly, the organic EL element in the red sub-pixel region preferably has the second optical length set from 210 nm to 230 nm. Thus, chromaticity of emitted light in an appropriate range can be ensured while increasing light extraction efficiency.

FIG. 5 shows results of a more detailed simulation with respect to red sub-pixels. The upper graph in FIG. 5 shows changes in light extraction efficiency, and the lower graph in FIG. 5 shows changes in chromaticity. When color correction using the color filter layer is implemented (solid line), light extraction efficiency peaks when the second optical length is approximately 220 nm. When the second optical length is from 210 nm to 230 nm, a high light extraction efficiency can be maintained when color correction is implemented using a color filter. Further, from the results of FIG. 4A and FIG. 5, it can be seen that light extraction efficiency peaks when the second optical length is 195 nm when color correction is not implemented, but does not peak when the second optical length is 195 nm when color correction is implemented. Thus, the proportion of unwanted blue light seems relatively large when the second optical length is approximately 195 nm.

Further, the organic EL element in the red sub-pixel region includes the first red light-emitting layer and the second blue light-emitting layer. When optimizing the second optical length, the first red light-emitting layer and the second blue light-emitting layer may be considered separately. In the present device it is not possible for only the second blue light-emitting layer to emit light without the first red light-emitting layer emitting light, but in a simulation such a condition can be reproduced. Accordingly, the condition of only the second blue light-emitting layer emitting light can be reproduced in a simulation, and the second optical length that produces the minimum light extraction efficiency can be sought. However, even if the first red light-emitting layer and the second blue light-emitting layer are separately optimized, it has been found that it is not always possible to optimize both light extraction efficiency and chromaticity. The dashed line in the graph of the upper half of FIG. 5 indicates light extraction efficiency when only the second blue light-emitting layer emits light and the first red light-emitting layer does not emit light. According to this simulation, for example, light extraction efficiency is low when the second optical length is in a range from 170 nm to 180 nm. In other words, when optimizing for only the second blue light-emitting layer, it is likely that the second optical length in the range from 170 nm to 180 nm would be selected. However, as stated above, a preferable range for the second optical length of the organic EL element in the red sub-pixel region is not in the range from 170 nm to 180 nm, and is in the range from 210 nm to 230 nm. Accordingly, when optimizing the second optical length, it is important to consider both the first red light-emitting layer and the second blue light-emitting layer at the same time, not separately. According to the present embodiment, the first red light-emitting layer and the second blue light-emitting layer are both considered at the same time, and therefore a range for the second optical length that optimizes both light extraction efficiency and chromaticity can be obtained.

Figure 4B:
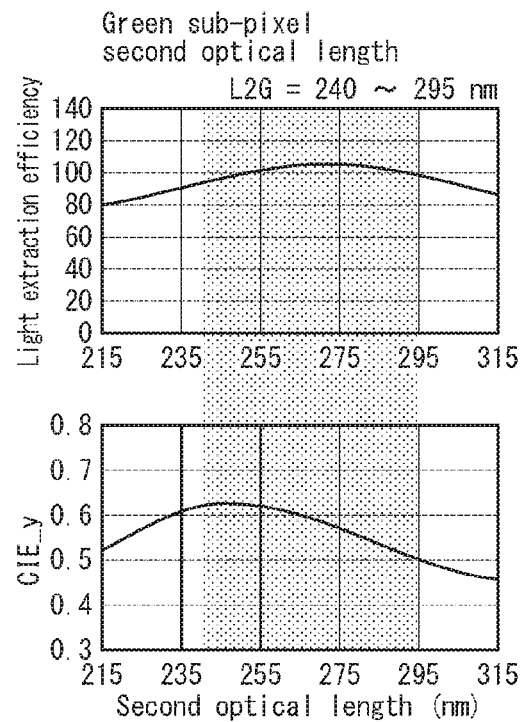

In FIG. 4B, the organic EL element in the green sub-pixel region has a peak light extraction efficiency when the second optical length is approximately 270 nm. When the second optical length is from 240 nm to 300 nm, peak values of light extraction efficiency equal to or greater than 90% can be ensured. On the other hand, when the second optical length is from 210 nm to 295 nm, a y value in an appropriate range for the green sub-pixel (equal to or greater than 0.50) can be ensured. Note that results around 210 nm are not shown in FIG. 4B. Accordingly, the organic EL element in the green sub-pixel region preferably has the second optical length set from 240 nm 295 nm. Thus, chromaticity of emitted light in an appropriate range can be ensured while increasing light extraction efficiency.

Figure 4C:
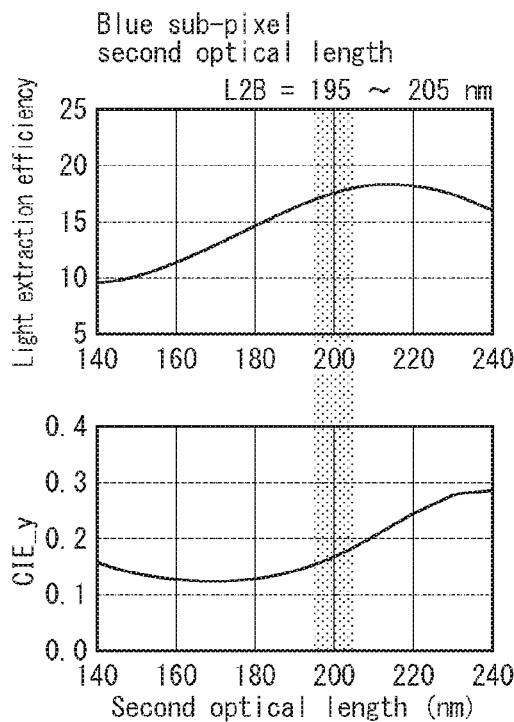

In FIG. 4C, the organic EL element in the blue sub-pixel region has a peak light extraction efficiency when the second optical length is approximately 210 nm. When the second optical length is from 195 nm to 235 nm, peak values of light extraction efficiency equal to or greater than 90% can be ensured. On the other hand, when the second optical length is from 130 nm to 205 nm, a y value in an appropriate range for the blue sub-pixel (equal to or less than 0.2, preferably equal to or less than 0.18) can be ensured. Note that results around 130 nm are not shown in FIG. 4C. The organic EL element in the blue sub-pixel region preferably has the second optical length set from 195 nm to 205 nm. Thus, chromaticity of emitted light in an appropriate range can be ensured while increasing light extraction efficiency.

FIG. 6 shows results of a more detailed simulation with respect to blue sub-pixels. The upper graph in FIG. 6 shows changes in light extraction efficiency, and the lower graph in FIG. 6 shows changes in chromaticity. As above, when optimizing the second optical length, the first blue light-emitting layer and the second blue light-emitting layer may be considered separately. The solid line in the graph of the upper half of FIG. 6 indicates light extraction efficiency when both the first blue light-emitting layer and the second blue light-emitting layer emit light. The dotted lines in each graph indicate light extraction efficiency when only the first blue light-emitting layer emits light and the second blue light-emitting layer does not emit light. The dashed lines in each graph indicate light extraction efficiency when only the second blue light-emitting layer emits light and the first blue light-emitting layer does not emit light. In each case, the color filter layer is used to correct chromaticity. Thus, when the first blue light-emitting layer and the second blue light-emitting layer both emit light, light extraction efficiency peaks when the second optical length is in a range from 195 nm to 205 nm. When only the second blue light-emitting layer emits light, light extraction efficiency peaks when the second optical length is in a range from 180 nm to 195 nm. When only the first blue light-emitting layer emits light, light extraction efficiency peaks when the second optical length is in a range from 215 nm to 235 nm. In other words, the second optical length that indicates peak light extraction efficiency when both the first blue light-emitting layer and the second blue light-emitting layer emit light is different from the second optical length that indicates peak light extraction efficiency when only the first blue light-emitting layer emits light or only the second blue light-emitting layer emits light. Accordingly, even if the first blue light-emitting layer and the second blue light-emitting layer are separately optimized, it is not always possible to optimize both light extraction efficiency and chromaticity. According to the present embodiment, the first blue light-emitting layer and the second blue light-emitting layer are both considered at the same time, and therefore a range for the second optical length that optimizes both light extraction efficiency and chromaticity can be obtained.

Figure 4D:
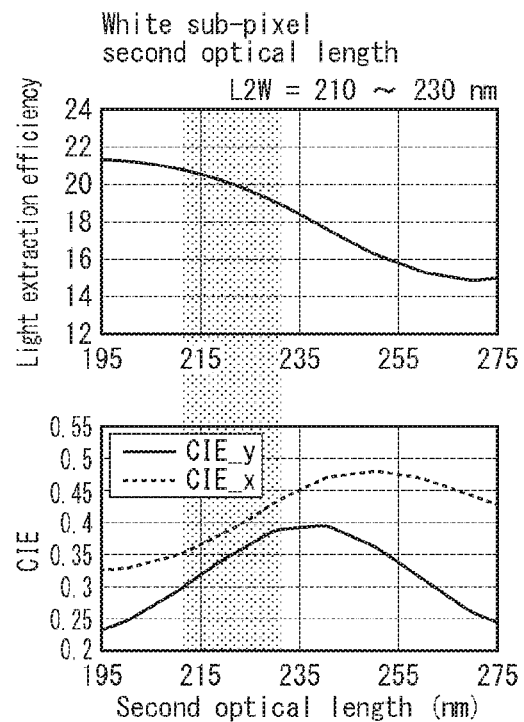

In FIG. 4D, the organic EL element in the white sub-pixel region has a peak light extraction efficiency when the second optical length is approximately 195 nm. When the second optical length is from 160 nm to 230 nm, peak values of light extraction efficiency equal to or greater than 90% can be ensured. Note that results around 160 nm are not shown in FIG. 4D. On the other hand, when the second optical length is from 210 nm to 230 nm, chromaticity of the mix of red light and blue light in a range that is close to white can be ensured. According to the present embodiment, the range that is close to white is defined as an x value from 0.25 to 0.45, a y value from 0.25 to 0.45, and an absolute value of difference between the x value and the y value from 0 to 0.05. Accordingly, the organic EL element in the white sub-pixel region preferably has the second optical length set from 210 nm to 230 nm. Thus, light extraction efficiency of the mix of red light and blue light is high, while the color of the mix of light is close to white.

Figure 7:
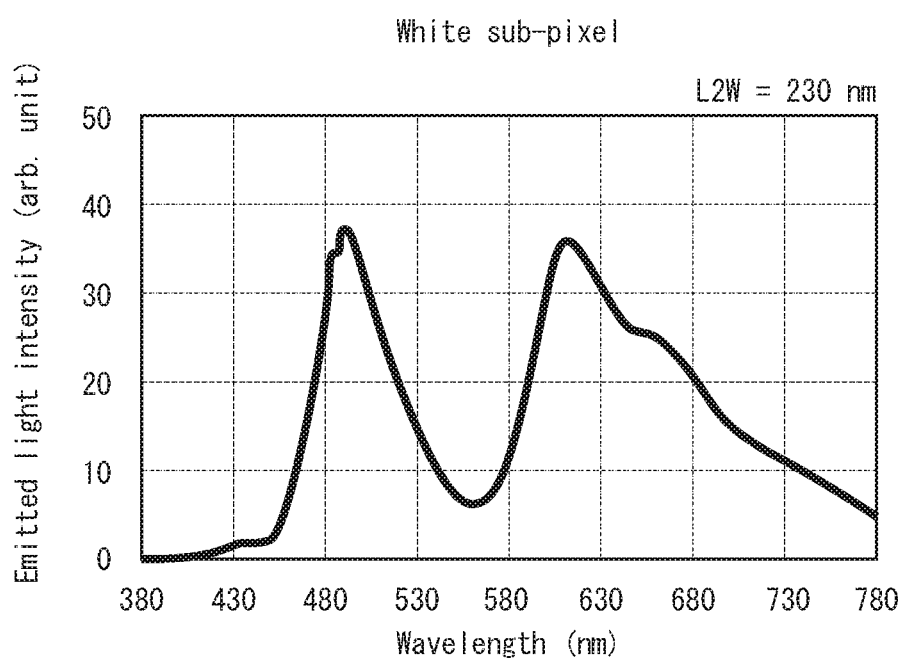
FIG. 7 illustrates a light emission spectrum of an organic EL element in a white sub-pixel region.

FIG. 7 illustrates a light emission spectrum of an organic EL element in a white sub-pixel region when the second optical length is 230 nm. Thus, although it is said that the color of the mix of light is close to white, it can be seen that the intensity of emitted light in the green wavelength band is weak. In an organic EL display, when pure white light is required, the organic EL element in the green sub-pixel region may be made to emit light, supplementing the organic EL element in the white sub-pixel region being made to emit light. Thus, pure white light can be obtained. Note that pure white light can also be obtained by organic EL elements in the red sub-pixel region, the green sub-pixel region, and the blue sub-pixel region being made to emit light. However, light emitted from the organic EL elements in the red sub-pixel region, the green sub-pixel region, and the blue sub-pixel region is emitted externally via transmission through the red filter, the green filter, and the blue filter, respectively. The red filter, the green filter, and the blue filter each absorb a portion of light, and are therefore to some extent linked to a reduction in light extraction efficiency. On the other hand, light emitted from the organic EL element in the white sub-pixel region is emitted externally without being transmitted through a filter. Accordingly, light extraction efficiency is increased when the organic EL elements in the white sub-pixel region and the green sub-pixel region are made to emit light, more so than when the organic EL elements in the red sub-pixel region, the green sub-pixel region, and the blue sub-pixel region are made to emit light.

[5. Optical Design Summary (Top-emission)]

In the red sub-pixel region 2R, the first optical length is preferably from 20 nm to 50 nm, and the second optical length is preferably from 210 nm to 230 nm. For example, when the first optical length is 30 nm and the second optical length is 220 nm, film thicknesses of each layer may be as follows:

First hole injection layer: 20 nm
First hole transport layer: 10 nm
First red light-emitting layer: 80 nm
First electron transport layer: 40 nm
Charge generating layer: 35 nm
Second hole transport layer: 35 nm In the green sub-pixel region 2G, the first optical length is preferably from 20 nm to 50 nm, and the second optical length is preferably from 240 nm to 295 nm. For example, when the first optical length is 50 nm and the second optical length is 240 nm, film thicknesses of each layer may be as follows:

First hole injection layer: 35 nm
First hole transport layer: 15 nm
Green light-emitting layer: 80 nm
First electron transport layer: 40 nm
Charge generating layer: 35 nm
Second hole transport layer: 35 nm In the blue sub-pixel region 2B, the first optical length is preferably from 20 nm to 60 nm, and the second optical length is preferably from 195 nm to 205 nm. For example, when the first optical length is 40 nm and the second optical length is 200 nm, film thicknesses of each layer may be as follows:

First hole injection layer: 30 nm
First hole transport layer: 10 nm
Second blue light-emitting layer: 50 nm
First electron transport layer: 40 nm
Charge generating layer: 35 nm
Second hole transport layer: 35 nm In the white sub-pixel region 2W, the first optical length is preferably from 20 nm to 50 nm, and the second optical length is preferably from 210 nm to 230 nm. For example, when the first optical length is 30 nm and the second optical length is 230 nm, film thicknesses of each layer may be as follows:

First hole injection layer: 20 nm
First hole transport layer: 10 nm
Second red light-emitting layer: 90 nm
First electron transport layer: 40 nm
Charge generating layer: 35 nm
Second hole transport layer: 35 nm According to the present embodiment, optical lengths in the red sub-pixel region 2R are within the ranges stated above, and therefore light extraction efficiency of red light emitted from the first red light-emitting layer 7R in the red sub-pixel region 2R is improved, while suppressing light extraction efficiency of blue light emitted from the second blue light-emitting layer 11. Further, optical lengths in the green sub-pixel region 2G are within the ranges stated above, and therefore light extraction efficiency of green light emitted from the green light-emitting layer 7G in the green sub-pixel region 2G is improved, while suppressing light extraction efficiency of blue light emitted from the second blue light-emitting layer 11. Further, optical lengths in the blue sub-pixel region 2B are within the ranges stated above, and therefore blue light emitted from both the first blue light-emitting layer 7B and the second blue light-emitting layer 11 can be efficiently extracted externally. Accordingly, current required to obtain a desired luminance is decreased, and therefore lifespan of current-driven organic EL elements can be increased. Further, optical lengths in the white sub-pixel region 2W are within the ranges stated above, and therefore light extraction efficiency of a mix of light emitted from the second red light-emitting layer 7W and light emitted from the second blue light-emitting layer 11 is improved, while bringing the color of the mix of light closer to white light.

According to the present embodiment, the charge generating layer 9 is present in the red sub-pixel region 2R, the green sub-pixel region 2G, the blue sub-pixel region 2B, and the white sub-pixel region 2W. Thus, the charge generating layer 9 can be formed without using a precise shadow mask. Accordingly, manufacturing cost and productivity improvements can be made.

Further, as stated above, preferable ranges for the second optical length are different for each of the red sub-pixel region 2R, the green sub-pixel region 2G, and the blue sub-pixel region 2B. The second optical length may be adjusted for the red sub-pixel region 2R, the green sub-pixel region 2G, and the blue sub-pixel region 2B by making the film thicknesses of the first red light-emitting layer 7R, the green light-emitting layer 7G, and the first blue light-emitting layer 7B different from each other. For example, when the first red light-emitting layer 7R, the green light-emitting layer 7G, and the first blue light-emitting layer 7B are formed by a wet process such as an inkjet method, film thicknesses can easily be made different from each other.

Further, when one or more layers (according to the present embodiment, the first hole injection layers 5 and the first hole transport layers 6) between the light-reflective electrodes 4 and the first light-emitting layers 7 are referred to as first functional layers, the second optical length may be adjusted for the red sub-pixel region 2R, the green sub-pixel region 2G, and the blue sub-pixel region 2B by making film thicknesses of the first functional layers different from each other. For example, when at least one of the layers included in the first functional layers are formed by a wet process such as an inkjet method, film thicknesses of the first functional layers can easily be made different in each of the sub-pixel regions.

According to the present embodiment, the preferred range of the second optical length in the red sub-pixel region 2R overlaps with the preferred range of the second optical length in the white sub-pixel region 2W. Accordingly, the second optical length in the red sub-pixel region 2R may be the same as the second optical length in the white sub-pixel region 2W, or may be different. When the same, each layer in the red sub-pixel region 2R and each layer in the white sub-pixel region 2W can be formed according to the same recipe, and therefore manufacturing is simplified. On the other hand, when different, extraction of blue light in the red sub-pixel region 2R can be suppressed while a balance between red light and blue light in the white sub-pixel region 2W can be established, making the color of emitted light closer to white.

Further, film thicknesses of each layer between the first light-emitting layers 7 and the light-transmissive electrode 13 (according to the present embodiment, the first electron transport layer 8, the charge generating layer 9, the second hole transport layer 10, the second blue light-emitting layer 11, and the second electron transport layer 12) may be the same thicknesses across the red sub-pixel region 2R, the green sub-pixel region 2G, the blue sub-pixel region, and the white sub-pixel region 2W. For example, when each layer is formed by vacuum deposition such as by a resistance heating method, thicknesses of each layer in each sub-pixel region become equal.

[6. Materials of Each Layer (Top-emission)]

The following gives examples of specific materials of each layer.

<First Substrate>

As an electrically insulative base material of the first substrate 1, glass or plastic may be used, for example. As a glass material, alkali-free glass, soda glass, non-fluorescent glass, phosphoric acid-based glass, boric acid-based glass, quartz glass, etc., may be used. As a plastic material, acrylic resin, styrene resin, polycarbonate resin, epoxy resin, polyethylene, polyester, polyimide, silicone resin, etc., may be used.

<Insulating Layer>

The insulating layer 3 is composed of resin material or inorganic material. As a resin material, a positive type of photosensitive material may be used. As such a photosensitive material, acrylic resin, polyimide resin, siloxane resin, or phenolic resin may be used. As an inorganic material, silicon nitride (SiN), silicon oxynitride (SiON), etc., may be used. The insulating layer 3 may be formed from only resin material, and may be formed from resin material and inorganic material.

<Reflective Electrodes>

The reflective electrodes 4 are composed of a light-reflective electrically-conductive material. As a light-reflective electrically-conductive material, aluminium (Al), aluminium alloy, silver (AG), silver-palladium-copper alloy (APC), silver-rubidium-gold alloy (ARA), molybdenum-chrome alloy (MoCr), nickel and chromium alloy (NiCr), molybdenum (Mo), molybdenum-tungsten alloy (MoW), etc., may be used. The light-reflective electrodes 4 may each contain a layer of a light-transmissive electrically-conductive material and a layer of a light-reflective electrically-conductive material. As a light-transmissive electrically-conductive material, indium tin oxide (ITO) or indium zinc oxide (IZO) may be used.

<Banks>

The banks 2 may be composed of an electrically-insulative resin material. As a resin material of the banks 2, a positive type of photosensitive material may be used. As such a photosensitive material, acrylic resin, polyimide resin, siloxane resin, or phenolic resin may be used.

<First Hole Injection Layers>

As a material of the first hole injection layers 5, a known material may be used. For example, an oxide of silver (Ag), molybdenum (Mo), chromium (Cr), vanadium (V), tungsten (W), nickel (Ni), iridium (Ir), etc., or an electrically conductive polymer such as poly(3,4-ethylenedioxythiophene) polystyrene sulfonate (PEDOT:PSS), or a low-molecular organic compound, polyfluorene, or derivative thereof such as a triazole derivative, an oxadiazole derivative, an imidazole derivative, a polyarylalkane derivative, a phenylenediamine derivative, an arylamine derivative, an oxazole derivative, a styryl anthracene derivative, a fluorenone derivative, a stilbene derivative, a porphyrin compound, an aromatic tertiary amine compound, a styryl amine compound, etc., or a high-molecular compound such as polyarylamine or a derivative thereof. In order to further increase hole injectivity, the low-molecular organic compounds listed above may be doped with an electron-accepting material described later.

<First Hole Transport Layers>

The first hole transport layers 6 are intended to promote hole injection from the first hole injection layers 5 to the first light-emitting layers 7 and block escape of electrons and exciton energy from the first light-emitting layers 7. As a material of the first hole transport layers 6, a known material may be used. For example, a material listed above for the first hole injection layers 5 may be used.

<First Light-emitting Layers>

As a material of the first light-emitting layers 7, a known material may be used. For example, an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound, azaquinolone compound, pyrazoline derivative, pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxy quinoline compound, metal complex of a 2-bipyridine compound, complex of Schiff salt and a group III metal, oxine metal complex, fluorescent substance such as a rare earth complex, a low-molecular compound such as a known phosphorescent material such as a metal complex that phosphoresces such as tris(2-phenylpyridine) iridium, or a high-molecular compound such as polyfluorene, a derivative thereof, polyarylamine, or a derivative thereof. The first light-emitting layers may also be formed from a combination of materials such as a mix of low-molecular material and low-molecular material, high molecular material and low-molecular material, etc.

<First Electron Transport Layer>

As a material of the first electron transport layer 8, a known material may be used. For example, an organic material, an alkali metal, an alkaline earth metal, an oxide of an alkali metal, an oxide of an alkaline earth metal, a fluoride, etc., may be used. As an organic material, an oxydiazole derivative (OXD), triazole derivative (TAZ), phenanthroline derivate (BCP, Bphen), perinone derivative, quinoline complex derivative, silole derivative, dimesityl-boron derivative, triaryl boron derivative, etc., may be used. As an alkali metal or alkaline earth metal, lithium (Li), sodium (Na), cesium (Cs), barium (Ba), or calcium (Ca) may be used. As an oxide or fluoride of an alkali metal or alkaline earth metal, lithium fluoride (LiF), sodium fluoride (NaF), lithium oxide (LiOx), barium oxide (BaOx), cesium carbonate (Cs2Co3), etc., may be used. With a view to further improving electron injectability, the organic material may be doped with the alkali metal, the alkaline earth metal, the oxide or fluoride of the alkali metal, the oxide or fluoride of the alkaline earth metal, etc. The first electron transport layer 8 may be formed from a plurality of layers, such as an organic layer and an alkali metal or alkaline earth metal layer, or an organic layer, an oxide or fluoride of an alkali metal or alkaline earth metal layer, or similar.

<Charge Generating Layer>

As a material and a configuration of the charge generating layer 9, a known material and configuration can be used. For example: an electron-accepting material; an electron-donating material; a layered body or mix of electron-accepting material and electron-donating material; a mix of organic material and electron-accepting material; a mix of organic material and electron-donating material; a layered body of a mix of organic material and electron-accepting material and a mix of organic material and electron-donating material; a layered body or mix of electron-accepting material and a metal or light-transmissive electrode; a layered body or mix of electron-donating material and a metal or light-transmissive electrode; a layered body of a layered body or mix of electron-accepting material and electron-donating material and a metal or light-transmissive electrode; a layered body of a mix of organic material and electron-accepting material and a metal or light-transmissive electrode; a layered body of a mix of organic material and electron-donating material and a metal or light-transmissive electrode; or a layered body of a metal and a light-transmissive electrode may be used.

As an electron-accepting material, an inorganic compound such as iron(III) chloride, iron(III) bromide, iron(III) iodide, gallium iodide, molybdenum oxide, vanadium oxide, or tungsten oxide may be used, or an organic compound such as dichloro-dicyano benzoquinone (DDQ), trinitrofluorenone (TNF), tetracyanoquinodimethane (TCNQ), tetrafluoro-tetracyanoqu i nod i methane (F4TCNQ), or a hexaazatriphenylene derivative (for example, HAT-CN6) may be used. As an electron-donating material, an alkali metal or alkaline earth metal such as lithium (Li), sodium (Na), cesium (Cs), barium (Ba), or calcium (Ca) may be used. As an organic material, a material listed for the first hole injection layers 5 or a material listed for the first electron transport layer 8 may be used. As a metal, a metal thin film of Ag, Au, or Al may be used, for example. As a light-transmissive electrode, indium tin oxide (ITO), indium zinc oxide (IZO), or zinc oxide (ZnO) may be used, for example.

When the first electron transport layer 8 and/or the second hole transport layer 10 include an electron-accepting material and/or electron-donating material, and/or when the charge generating layer 9 includes a metal or light-transmissive electrode, the first electron transport layer 8 and/or the second hole transport layer 10 may be used as a portion of the charge generating layer 9.

According to the present application, as long as the charge generating layer 9 supplies electrons to the first electron transport layer 8 and supplies holes to the second hole transport layer 10, the configuration of the charge generating layer 9 should not be construed as being limited to any particular configuration.

According to the present embodiment, the charge generating layer 9 includes hexaazatriphenylene hexacarbonitrile (HAT-CN6), which is an electron-donating material.

<Second Hole Transport Layer>

As a material of the second hole transport layer 10, a known material may be used. For example, a material listed above for the first hole injection layers 5 may be used.

The second hole transport layer 10 may be formed as one layer, or may be formed with an additional layer. In order to further improve hole injectivity, the second hole transport layer 10 may be doped with an electron-accepting material.

<Second Blue Light-emitting Layer>

As a material of the second blue light-emitting layer 11, a known material may be used. For example, a material listed above for the first light-emitting layers 7 may be used. The second blue light-emitting layer 11 may also be formed from a variety of combinations of materials such as a mix of low-molecular material and low-molecular material.

<Second Electron Transport Layer>

As a material of the second electron transport layer 12, a known material may be used. For example, a material listed above for the first electron transport layer 8 may be used. In order to further improve electron injectability, an organic layer may be doped with an alkali metal, an alkaline earth metal, an oxide or fluoride of an alkali metal, an oxide or fluoride of an alkaline earth metal, etc. The second electron transport layer 12 may be formed from a plurality of layers, such as an organic layer and an alkali metal or alkaline earth metal layer, or an organic layer and an oxide or fluoride of an alkali metal or alkaline earth metal layer, or similar.

<Light-transmissive Electrode>

The light-transmissive electrode 13 is composed of a light-transmissive electrically-conductive material. As a light-transmissive electrically-conductive material, indium tin oxide (ITO) or indium zinc oxide (IZO) may be used.

<Protective Layer>

The protective layer 14 is composed of resin material or inorganic material. As an inorganic material, silicon nitride (SiN) or silicon oxynitride (SiON) may be used. As a resin material, a resin adhesive may be used. The protective layer 14 may be a layered body including an inorganic layer and a resin layer.

<Color Filter Layer>

As a material of the color filter layer, a known material may be used.

<Second Substrate>

As a material of the second substrate 16, glass or plastic may be used, for example. As a glass material, alkali-free glass, soda glass, non-fluorescent glass, phosphoric acid-based glass, boric acid-based glass, quartz glass, etc., may be used. As a plastic material, acrylic resin, styrene resin, polycarbonate resin, epoxy resin, polyethylene, polyester, polyimide, silicone resin, etc., may be used. When a plastic material is used, the second substrate 16 may include a protective layer for suppressing intrusion of moisture or oxygen.

[7. Organic EL Display Panel Manufacturing Method (Top-emission)]

A method of manufacturing an organic EL display panel pertaining to the present embodiment is described below, with reference to FIG. 8A, FIG. 8B, FIG. 8C, FIG. 8D, and FIG. 8E.

Figure 8A:
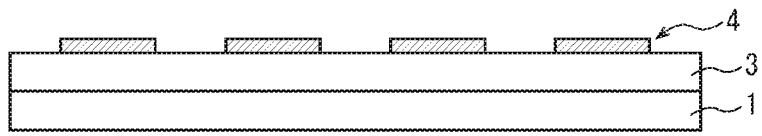
FIG. 8A, FIG. 8B, FIG. 8C, FIG. 8D, and FIG. 8E illustrate an organic EL display panel manufacturing method pertaining to Embodiment 1.

As shown in FIG. 8A, the insulating layer 3 is formed on the first substrate 1. The light-reflective electrodes 4 are formed, spaced apart from each other, on the insulating layer 3. The light-reflective electrodes 4 can, for example, be formed by forming an electrically-conductive film including a light-reflective electrically-conductive material on the insulating layer 3 by sputtering, then patterning the electrically-conductive film by etching.

Figure 8B:
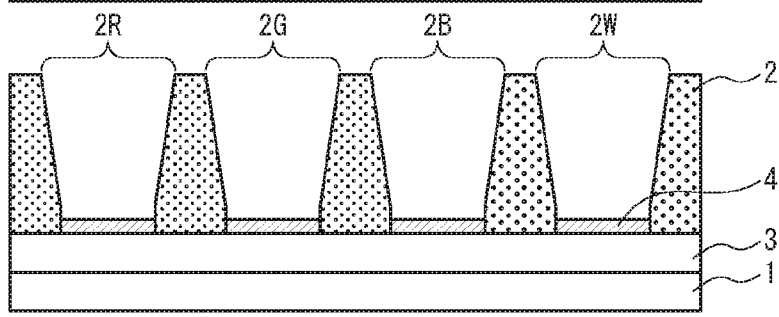

As shown in FIG. 8B, the banks 2 are formed on the first substrate 1. The banks 2 can be formed by forming a photosensitive layer from a photosensitive material on the insulating layer 3, exposing the photosensitive layer to light through a photomask, and developing the photosensitive layer that is exposed to light. When the first hole injection layers 5, the first hole transport layers 6, and the first light-emitting layers 7 are formed by wet processes, the banks 2 function as structures for preventing overflow of applied ink.

Figure 8C:
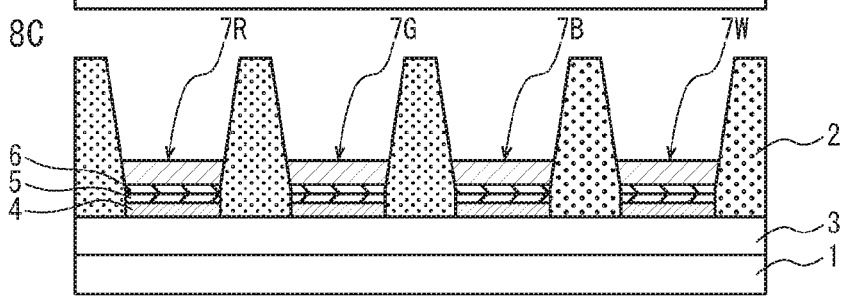

As shown in FIG. 8C, the first hole injection layers 5, the first hole transport layers 6, the first red light-emitting layer 7R, the green light-emitting layer 7G, the first blue light-emitting layer 7B, and the second red light-emitting layer 7W are formed. These layers can, for example, be formed by using wet processes such as an inkjet method.

Figure 8D:
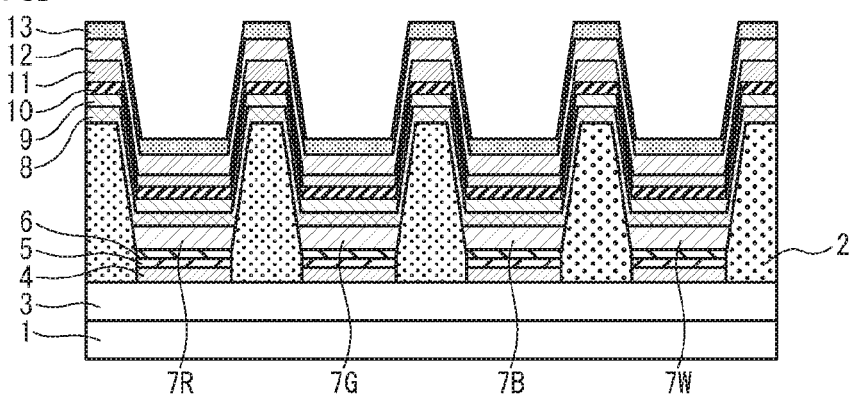

As shown in FIG. 8D, the first electron transport layer 8, the charge generating layer 9, the second hole transport layer 10, the second blue light-emitting layer 11, and the second electron transport layer 12 are formed. These layers can, for example, be formed by using a vacuum deposition method such as a resistance heating method.

Figure 8E:
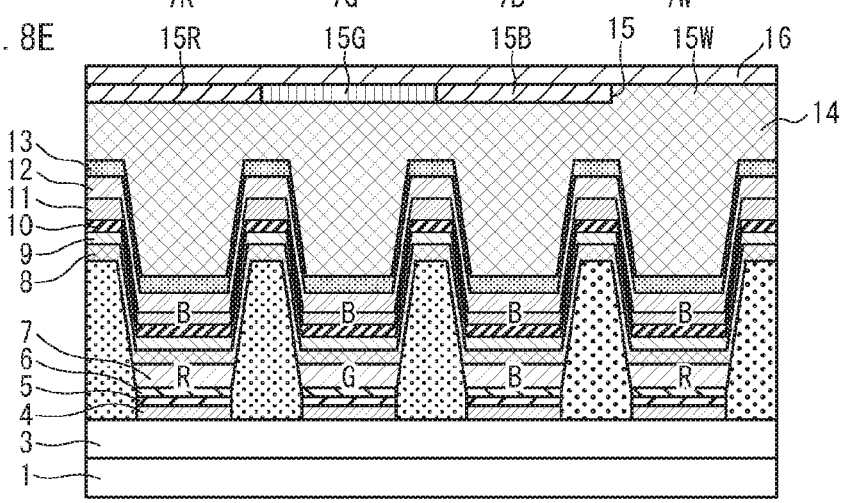

As shown in FIG. 8E, the light-transmissive electrode 13 is formed. This layer can, for example, be formed by using a vacuum deposition method such as a resistance heating method, or a dry method such as sputtering, reactive sputtering, or ion plating. Subsequently, the protective layer 14 is formed and the protective layer 14 is covered by the color filter layer 15 and the second substrate 16.

[8. Configuration of Organic EL Display Panel (Bottom-emission)]

Figure 9:
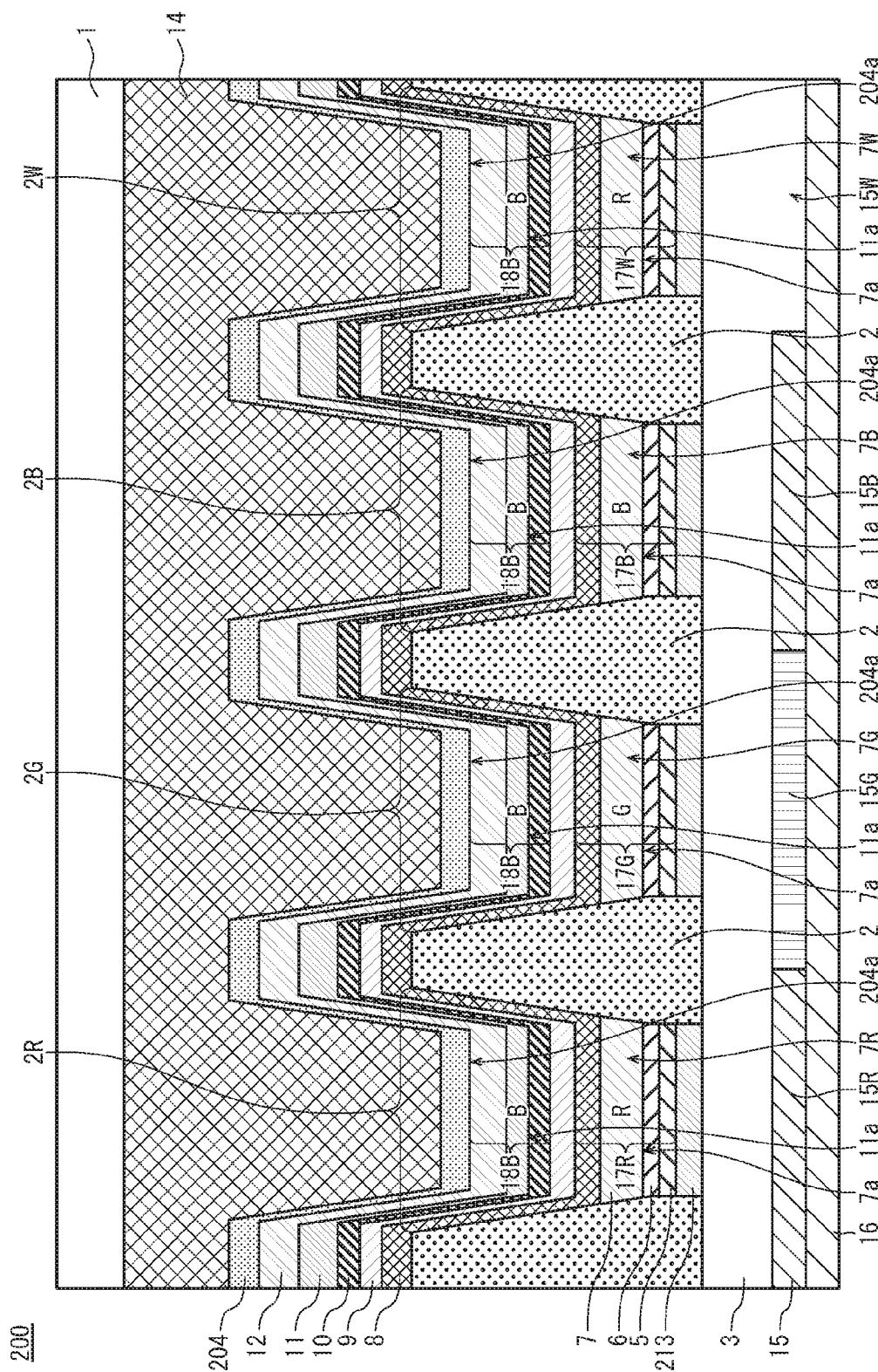
FIG. 9 is a cross-section enlargement of a pixel of an organic EL display panel pertaining to Embodiment 2.

A configuration of an organic EL display panel pertaining to Embodiment 2 of the present disclosure is described below, with reference to FIG. 9. FIG. 9 is a cross-section enlargement of a pixel of an organic EL display panel pertaining to Embodiment 2 of the present disclosure. According to the present embodiment, an organic EL display panel 200 is a so-called "bottom-emission" type, in which a display surface thereof is towards the lower side of FIG. 9.

The organic EL display panel 200 includes the second substrate 16, the color filter 15, the banks 2, the insulating layer 3, light-transmissive electrodes 213, the first hole injection layers 5, the first hole transport layers 6, the first red light-emitting layer 7R, the green light-emitting layer 7G, the first blue light-emitting layer 7B, the second red light-emitting layer 7W, the first electron transport layer 8, the charge generating layer 9, the second hole transport layer 10, the second blue light-emitting layer 11, the second electron transport layer 12, a light-reflective electrode 204, the protective layer 14, and the second substrate 1. The functions of each layer, materials, and method of manufacture are the same as for Embodiment 1, and therefore description thereof is not repeated here.

[9. Optical Design (Bottom-emission)]

Figure 10:
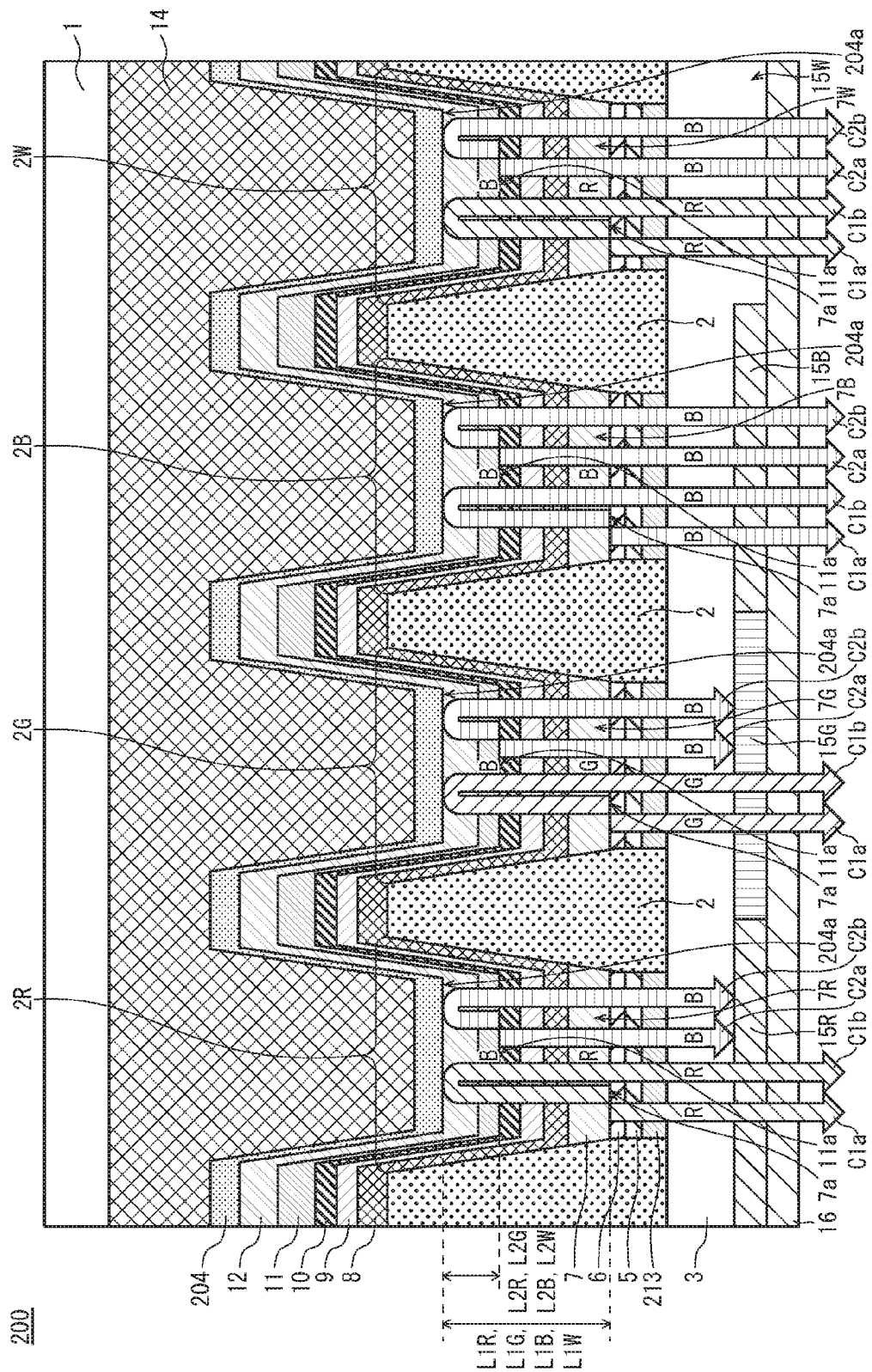
FIG. 10 illustrates light paths of light emitted from organic EL elements pertaining to Embodiment 2.

FIG. 10 illustrates optical paths of light emitted from the organic EL elements in sub-pixel regions.

An optical path C1*a* is an optical path of light travelling from one of the first light-emitting layers 7, towards one of the light-transmissive electrodes 213, without travelling towards the light-reflective electrode 204. An optical path C1*b* is an optical path of light travelling from one of the first light-emitting layers 7 towards the light-reflective electrode 204, being reflected at the light-reflective electrode 204, and subsequently travelling towards one of the light-transmissive electrodes 213. An optical path C2*a* is an optical path of light travelling from the second blue light-emitting layer 11, towards one of the light-transmissive electrodes 213, without travelling towards the light-reflective electrode 204. An optical path C2*b* is an optical path of light travelling from the second blue light-emitting layer 11 towards the light-reflective electrode 204, being reflected at the light-reflective electrode 204, and subsequently travelling towards one of the light-transmissive electrodes 213.

According to the present embodiment, when designing microcavity structure of an organic EL element, it is sufficient to consider optical lengths L1R, L1G, L1B, L1W (hereinafter, "first optical lengths") between the light-emitting surfaces 7*a* of the first light-emitting layers 7 and light-reflecting surfaces 204*a* of the light-reflective electrode 204 and optical lengths L2R, L2G, L2B, L2W (hereinafter, "second optical lengths") between the light-emitting surfaces 11*a* of the second blue light-emitting layer 11 and the light reflecting surfaces 204*a* of the light-reflective electrode 204.

[10. Second Optical Lengths (Bottom-emission)]

According to the present embodiment, the first hole injection layers 5, the first hole transport layers 6, the first red light-emitting layer 7R, the green light-emitting layer 7G, the first blue light-emitting layer 7B, and the second red light-emitting layer 7W are described as being formed by wet processes. Further, the first electron transport layer 8, the charge generating layer 9, the second hole transport layer 10, the second blue light-emitting layer 11, and the second electron transport layer 12 are described as being formed by vacuum deposition. Further, a shadow mask is not used in the vacuum deposition. In this case, the second optical lengths are the same for each of the red sub-pixel region 2R, the green sub-pixel region 2G, the blue sub-pixel region 2B, and the white sub-pixel region 2W.

Figure 11:
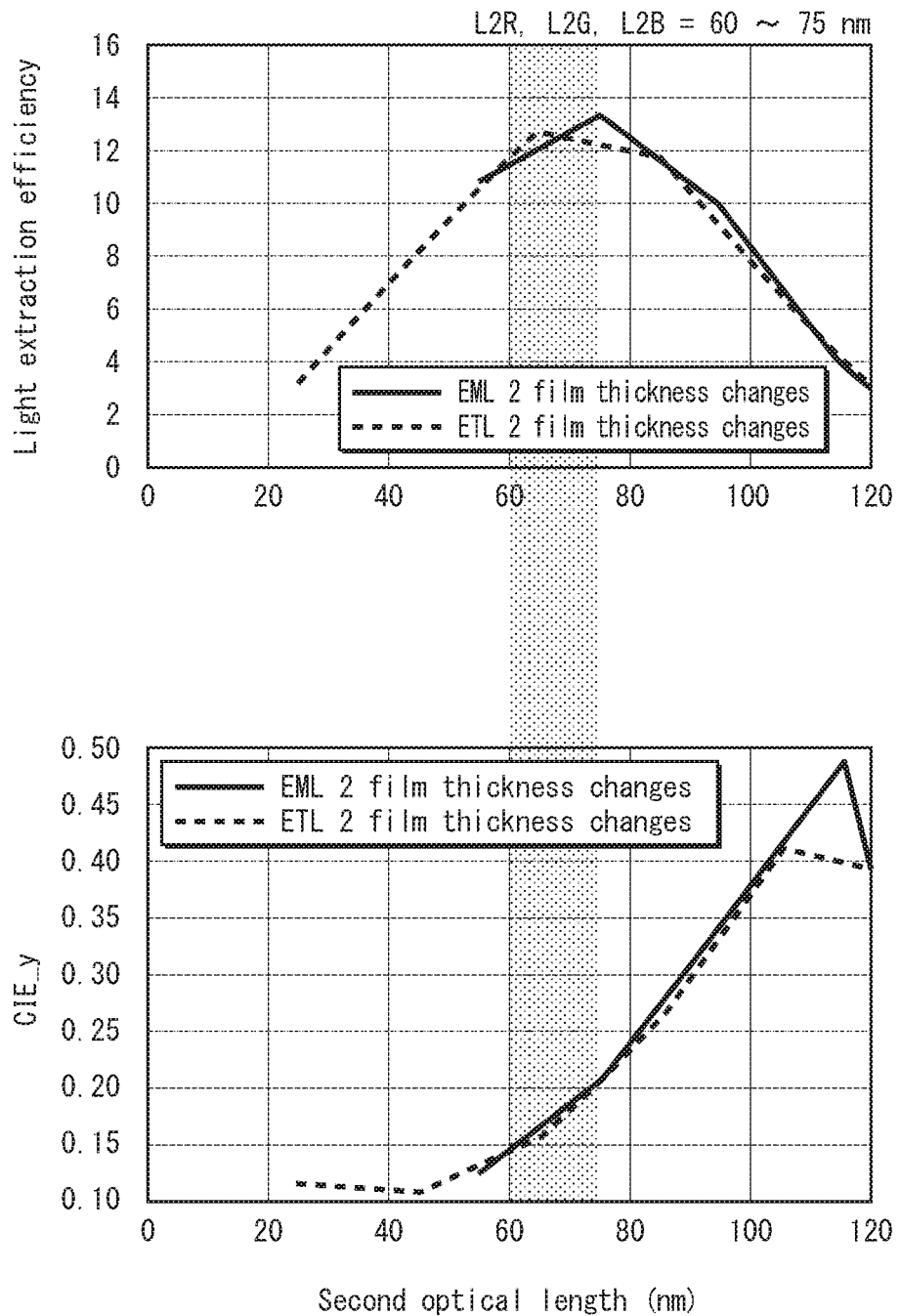
FIG. 11 illustrates changes in light extraction efficiency and chromaticity of light emitted from an organic EL element with respect to second optical lengths.

FIG. 11 shows optical simulation results, and indicates changes in light extraction efficiency and chromaticity of organic EL elements with respect to the second optical lengths. Light extraction efficiency indicates a value prior to light absorption by the color filter layer, i.e., a value of light emitted from a second blue light-emitting layer. Base values for film thickness of each layer were set as follows:

Light-transmissive electrode: 50 nm (ITO)

First hole injection layer: 25 nm (electrically conductive polymer material)

First hole transport layer: 20 nm (amine compound)
First light-emitting layer: 70 nm (polyfluorene derivative)
First electron transport layer: 35 nm (phenanthroline derivative)
Charge generating layer: 10 nm (HAT-CN6)
Second hole transport layer: 25 nm (amine compound)
Second blue light-emitting layer: 25 nm (anthracene compound)
Second electron transport layer: 35 nm (phenanthroline derivative)
Light-reflective electrode: 120 nm (aluminium)

Refractive indices of the materials were evaluated by spectroscopic ellipsometry.

According to the present embodiment, second optical lengths are represented by the sum of film thicknesses of the second electron transport layer and the second blue light-emitting layer. FIG. 11 shows cases in which film thicknesses of the second electron transport layers are varied (dashed lines) and cases in which film thicknesses of the second blue light-emitting layers are varied (solid lines). Because both materials are organic materials, they have substantially the same refractive indices. Thus, it can be seen that changes in either film thickness shows the same trends. In other words, film thickness of any layer between the light-reflecting surfaces of a light-reflective electrode and light-emitting surfaces of the second blue light-emitting layer may be adjusted, and a layer such as the second hole injection layer may be added.

In FIG. 11, the organic EL element in each sub-pixel region has a peak light extraction efficiency when the second optical length is approximately 70 nm. When the second optical length is from 60 nm to 80 nm, peak values of light extraction efficiency equal to or greater than 90% can be ensured. On the other hand, it can be seen that chromaticity of emitted light worsens (increases) as the second optical length increases. To emit light as blue light, a y value of 0.20 or less is preferable. A y value of 0.20 or less can be ensured as long as the second optical length is 75 nm or less. Accordingly, a second optical length from 60 nm to 75 nm is preferable. Thus, chromaticity of emitted light in a blue range can be ensured while increasing light extraction efficiency.

[11. First Optical Lengths (Bottom-emission)]

Figure 12A:
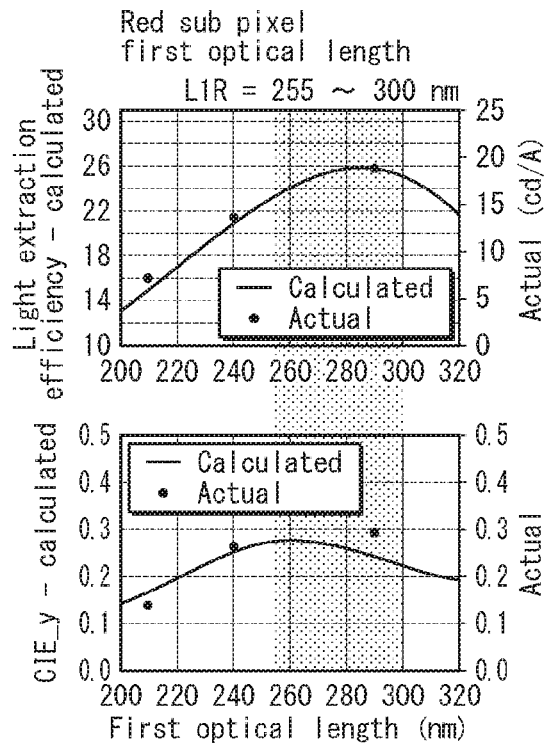
FIG. 12A, FIG. 12B, FIG. 12C, and FIG. 12D illustrate changes in light extraction efficiency and chromaticity of light emitted from an organic EL element with respect to first optical lengths.

FIG. 12A, FIG. 12B, FIG. 12C, and FIG. 12D show optical simulation results, and indicate changes in light extraction efficiency and chromaticity of organic EL elements with respect to the first optical lengths. FIG. 12A indicates a red sub-pixel, FIG. 12B indicates a green sub-pixel, FIG. 12C indicates a blue sub-pixel, and FIG. 12D indicates a white sub-pixel. Light extraction efficiency indicates a value prior to light absorption by the color filter layer, i.e., a value with respect to the sum of light emitted from a first light-emitting layer and light emitted from the second blue light-emitting layer. Base values for film thickness of each layer were set as follows:

Light-transmissive electrode: 50 nm (ITO)
First hole injection layer: 25 nm (electrically conductive polymer material)
First hole transport layer: 20 nm (amine compound)
First light-emitting layer: 70 nm (polyfluorene derivative)
First electron transport layer: 35 nm (phenanthroline derivative)
Charge generating layer: 10 nm (HAT-CN6)
Second hole transport layer: 25 nm (amine compound)
Second blue light-emitting layer: 25 nm (anthracene compound)
Second electron transport layer: 35 nm (phenanthroline derivative)
Light-reflective electrode: 120 nm (aluminium)

Refractive indices of the materials were evaluated by spectroscopic ellipsometry.

According to the present embodiment, the first optical lengths are represented by the sum of film thicknesses of the second electron transport layer, the second blue light-emitting layer, the second hole transport layer, the charge generating layer, the first electron transport layer, and one of the first light-emitting layers. In this example, aside from the first light-emitting layers, film thickness in each sub-pixel region cannot be varied as layers are formed by dry processes that do not use a shadow mask. The first light-emitting layers are formed by wet processes and can therefore be implemented with different film thicknesses for each sub-pixel region. FIG. 12A, FIG. 12B, FIG. 12C, and FIG. 12D show optical simulation data (solid lines) indicating changes in light extraction efficiency and chromaticity when film thickness of one of the first light-emitting layers is changed, and show experimental data (points) indicating properties of actually produced organic EL elements. A close match is shown between the optical simulations and the experimental data, indicating that predictions made based on the optical simulations are reliable.

Figure 13A:
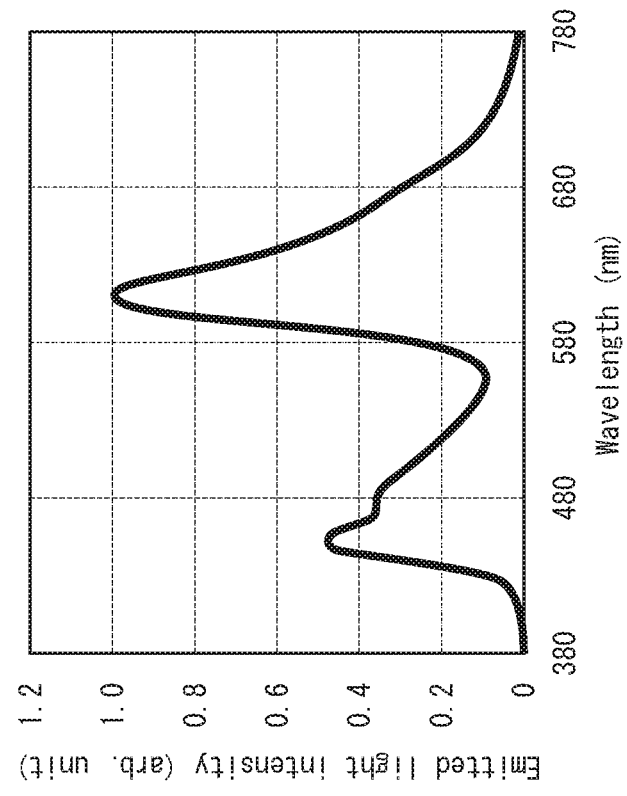
FIG. 13A illustrates a light emission spectrum when the first optical length is 210 nm.
Figure 13B:
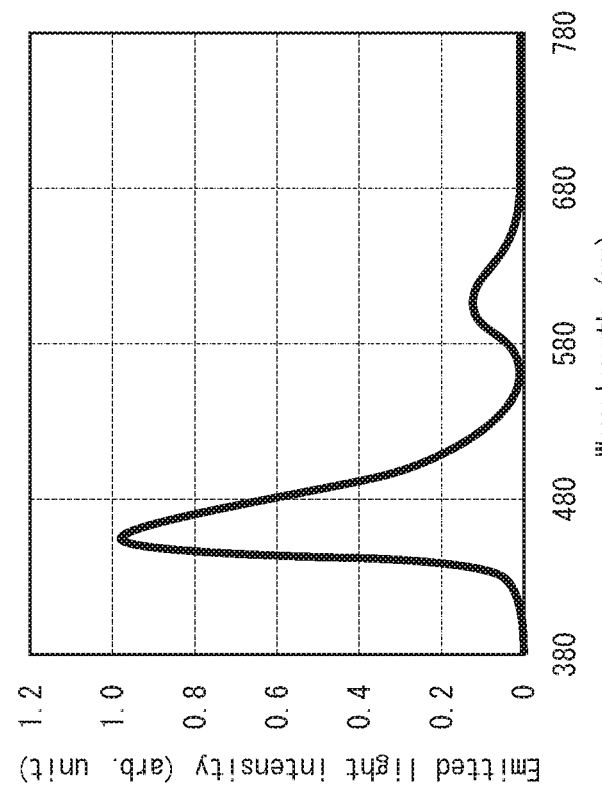
FIG. 13B illustrates a light emission spectrum when the first optical length is 290 nm.

In FIG. 12A, the organic EL element in the red sub-pixel region has a peak light extraction efficiency when the first optical length is approximately 290 nm. When the first optical length is from 255 nm to 315 nm, peak values of light extraction efficiency equal to or greater than 90% can be ensured. However, when the first optical length is 300 nm or greater, thickness of the first red light-emitting layer becomes 170 nm or greater, and the drive voltage of the organic EL element becomes very high. Accordingly, the organic EL element in the red sub-pixel region preferably has the first optical length set from 255 nm to 300 nm. FIG. 13A shows a light emission spectrum when the first optical length is 210 nm, and FIG. 13B shows a light emission spectrum when the first optical length is 290 nm. It can be seen that when the first optical length is 210 nm, blue light emission is very strong, and when the first optical length is 290 nm, red light emission is strong and blue light emission is suppressed. Accordingly, by limiting the first optical length to the range described above, unwanted blue light emission can be suppressed and red light emission can be strongly extracted, and as a result, chromaticity of emitted light in an appropriate range can be ensured and light extraction efficiency can be increased.

FIG. 14 shows results of a more detailed simulation with respect to red sub-pixels. The upper graph in FIG. 14 shows changes in light extraction efficiency, and the lower graph in FIG. 14 shows changes in chromaticity. When color correction using the color filter layer is implemented (solid line), light extraction efficiency peaks when the first optical length is approximately 270 nm. When the first optical length is from 255 nm to 300 nm, a high light extraction efficiency can be maintained when color correction is implemented using a color filter.

Further, as described with respect to Embodiment 1, when optimizing the first optical length, the first red light-emitting layer and the second blue light-emitting layer may be considered separately. The solid line in the graph of the upper half of FIG. 14 indicates light extraction efficiency when both the first red light-emitting layer and the second blue light-emitting layer emit light. The dashed lines in each graph indicate light extraction efficiency when only the first red light-emitting layer emits light and the second blue light-emitting layer does not emit light. In each case, color correction is implemented by using a color filter layer. Thus, when the first red light-emitting layer and the second blue light-emitting layer both emit light, light extraction efficiency peaks when the second optical length is in a range from 255 nm to 300 nm. When only the first red light-emitting layer emits light, light extraction efficiency peaks when the first optical length is in a range from 300 nm to 320 nm. In other words, the first optical length that indicates peak light extraction efficiency when both the first red light-emitting layer and the second blue light-emitting layer emit light is different from the first optical length that indicates peak light extraction efficiency when only the first red light-emitting layer emits light. Accordingly, even if the first red light-emitting layer and the second blue light-emitting layer are separately optimized, it is not always possible to optimize both light extraction efficiency and chromaticity. According to the present embodiment, the first red light-emitting layer and the second blue light-emitting layer are both considered at the same time, and therefore a range for the first optical length that optimizes both light extraction efficiency and chromaticity can be obtained.

Figure 12B:
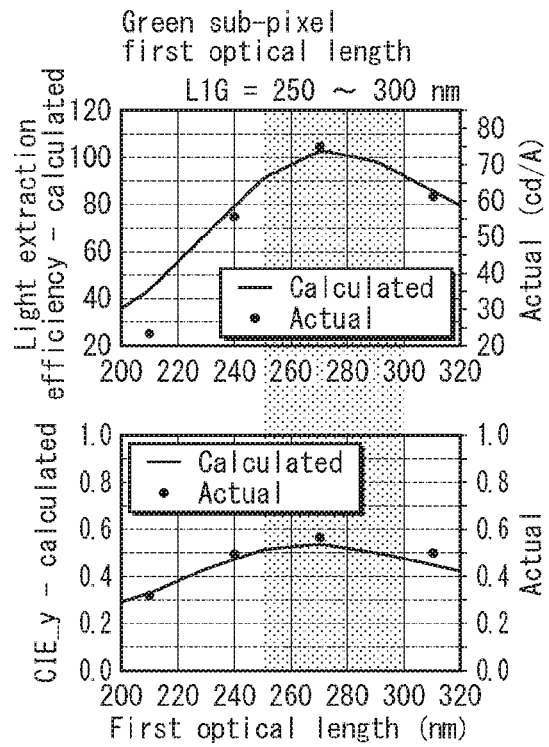

In FIG. 12B, the organic EL element in the green sub pixel region has a peak light extraction efficiency when the first optical length is approximately 270 nm. When the first optical length is from 250 nm to 300 nm, peak values of light extraction efficiency equal to or greater than 90% can be ensured. Further, in this range, a y value in an appropriate range for the green sub-pixel (y value equal to or greater than 0.50) can be ensured. Accordingly, a first optical length from 250 nm to 300 nm is preferable. Thus, chromaticity of emitted light in an appropriate range can be ensured while increasing light extraction efficiency.

Figure 12C:
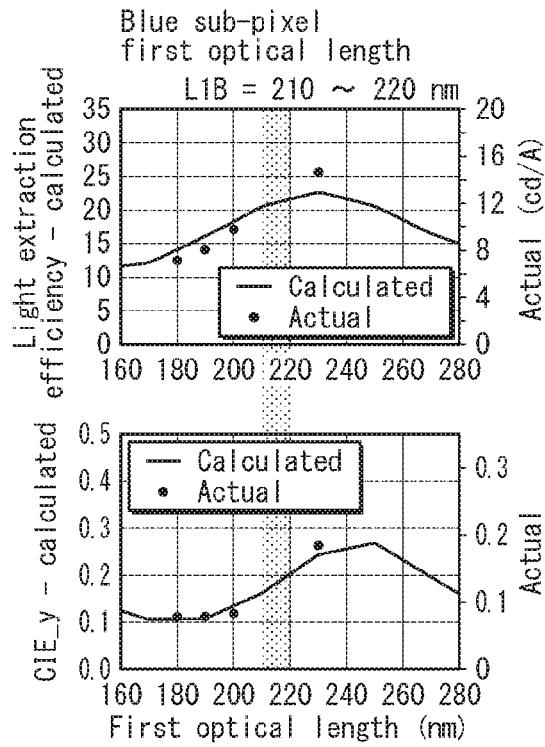

In FIG. 12C, the organic EL element in the blue sub pixel region has a peak light extraction efficiency when the first optical length is approximately 230 nm. When the first optical length is from 210 nm to 250 nm, peak values of light extraction efficiency equal to or greater than 90% can be ensured. When the first optical length is equal to or less than 220 nm, a y value in an appropriate range for the blue sub-pixel (y value equal to or less than 0.2, even more preferably equal to or less than 0.18) can be ensured. Accordingly, the organic EL element in the blue sub pixel region preferably has the first optical length set from 210 nm to 220 nm. Thus, chromaticity of emitted light in an appropriate range can be ensured while increasing light extraction efficiency.

Figure 15:
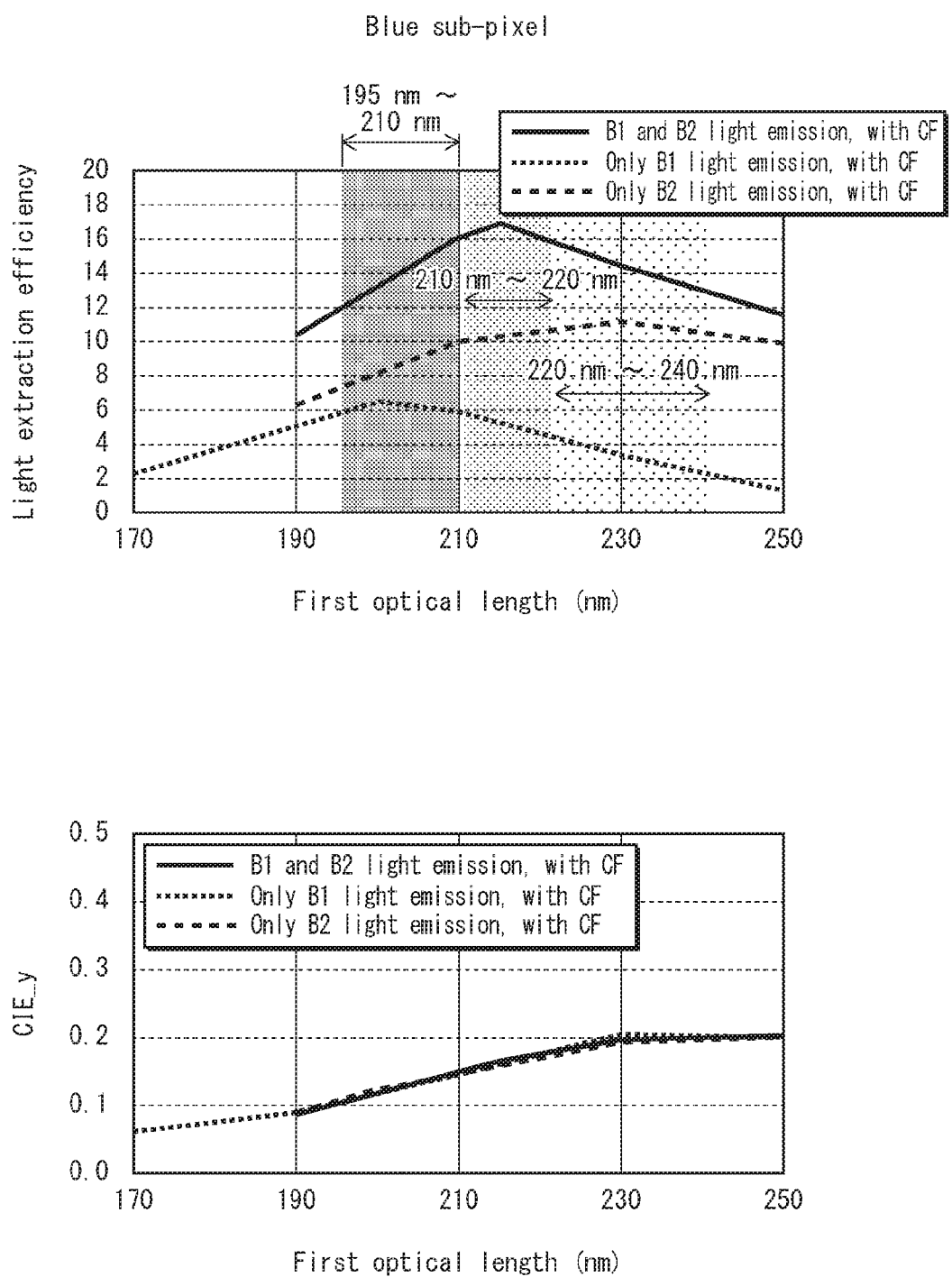
FIG. 15 illustrates a more detailed simulation with respect to blue sub-pixels.

FIG. 15 shows results of a more detailed simulation with respect to blue sub-pixels. The upper graph in FIG. 15 shows changes in light extraction efficiency, and the lower graph in FIG. 15 shows changes in chromaticity. As above, when optimizing the first optical length, the first blue light-emitting layer and the second blue light-emitting layer may be considered separately. The solid line in the graph of the upper half of FIG. 15 indicates light extraction efficiency when both the first blue light-emitting layer and the second blue light-emitting layer emit light. The dotted lines in each graph indicate light extraction efficiency when only the first blue light-emitting layer emits light and the second blue light-emitting layer does not emit light. The dashed lines in each graph indicate light extraction efficiency when only the second blue light-emitting layer emits light and the first blue light-emitting layer does not emit light. In each case, the color filter layer is used to correct chromaticity. Thus, when the first blue light-emitting layer and the second blue light-emitting layer both emit light, light extraction efficiency peaks when the first optical length is in a range from 210 nm to 220 nm. When only the first blue light-emitting layer emits light, light extraction efficiency peaks when the first optical length is in a range from 195 nm to 210 nm. When only the second blue light-emitting layer emits light, light extraction efficiency peaks when the first optical length is in a range from 220 nm to 240 nm. In other words, the first optical length that indicates peak light extraction efficiency when both the first blue light-emitting layer and the second blue light-emitting layer emit light is different from the first optical length that indicates peak light extraction efficiency when only the first blue light-emitting layer emits light or when only the second light light-emitting layer emits light. Accordingly, even if the first blue light-emitting layer and the second blue light-emitting layer are separately optimized, it is not always possible to optimize both light extraction efficiency and chromaticity. According to the present embodiment, the first blue light-emitting layer and the second blue light-emitting layer are both considered at the same time, and therefore a range for the second optical length that optimizes both light extraction efficiency and chromaticity can be obtained.

Figure 12D:
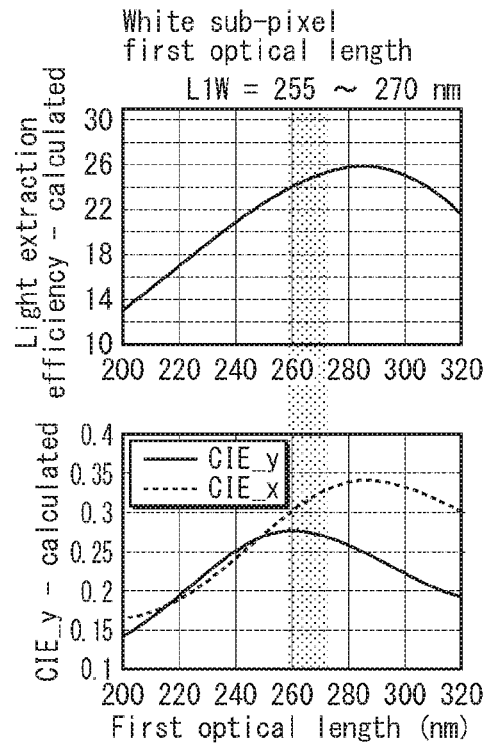
Figure 16:
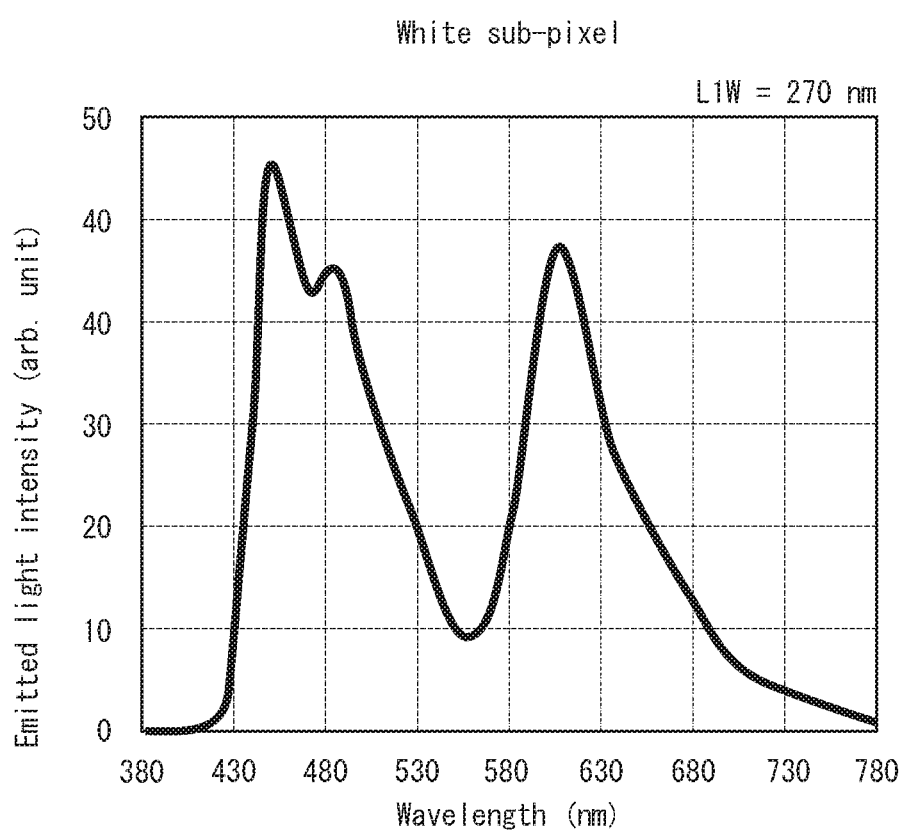
FIG. 16 illustrates a light emission spectrum of an organic EL element in a white sub-pixel region.

In FIG. 12D, the organic EL element in the white sub-pixel region has a peak light extraction efficiency when the first optical length is approximately 290 nm. When the first optical length is from 255 nm to 315 nm, peak values of light extraction efficiency equal to or greater than 90% can be ensured. On the other hand, when the first optical length is from 245 nm to 270 nm, chromaticity of the mix of red light and blue light in a range that is close to white can be ensured. According to the present embodiment, as with Embodiment 1, an x value from 0.25 to 0.45, a y value from 0.25 to 0.45, and an absolute value of difference between the x value and the y value from 0 to 0.05 ensures chromaticity close to white. Accordingly, the organic EL element in the white sub-pixel region preferably has the second optical length set from 255 nm to 270 nm. Thus, light extraction efficiency of the mix of red light and blue light is high, while the color of the mix of light is close to white. FIG. 16 illustrates a light emission spectrum of an organic EL element in a white sub-pixel region when the first optical length is 270 nm.

[12. Optical Design Summary (Bottom-emission)]

In the red sub-pixel region 2R, the first optical length is preferably from 255 nm to 300 nm, and the second optical length is preferably from 60 nm to 75 nm. For example, when the first optical length is 290 nm and the second optical length is 60 nm, film thicknesses of each layer may be as follows:

First red light-emitting layer: 160 nm
First electron transport layer: 35 nm
Charge generating layer: 10 nm
Second hole transport layer: 25 nm
Second blue light-emitting layer: 25 nm
Second electron transport layer: 35 nm In the green sub-pixel region 2G, the first optical length is preferably from 250 nm to 300 nm, and the second optical length is preferably from 60 nm to 75 nm. For example, when the first optical length is 290 nm and the second optical length is 60 nm, film thicknesses of each layer may be as follows:

Green light-emitting layer: 160 nm
First electron transport layer: 35 nm
Charge generating layer: 10 nm
Second hole transport layer: 25 nm
Second blue light-emitting layer: 25 nm
Second electron transport layer: 35 nm In the blue sub-pixel region 2B, the first optical length is preferably from 210 nm to 220 nm, and the second optical length is preferably from 60 nm to 75 nm. For example, when the first optical length is 215 nm and the second optical length is 60 nm, film thicknesses of each layer may be as follows:

First blue light-emitting layer: 85 nm
 First electron transport layer: 35 nm
 Charge generating layer: 10 nm
 Second hole transport layer: 25 nm
 Second blue light-emitting layer: 25 nm
 Second electron transport layer: 35 nm In the white sub-pixel region 2W, the first optical length is preferably from 255 nm to 270 nm, and the second optical length is preferably from 60 nm to 75 nm. For example, when the first optical length is 270 nm and the second optical length is 60 nm, film thicknesses of each layer may be as follows:

First red light-emitting layer: 140 nm
 First electron transport layer: 35 nm
 Charge generating layer: 10 nm
 Second hole transport layer: 25 nm
 Second blue light-emitting layer: 25 nm
 Second electron transport layer: 35 nm According to the present embodiment, as with Embodiment 1, light extraction efficiency of unwanted blue light can be suppressed in the red sub-pixel region 2R and the green sub-pixel region 2G, blue light can be efficiently extracted from the blue sub-pixel region 2B, and the mix of light can be efficiently extracted from the white sub-pixel region 2W while making the chromaticity of the mix of light close to white.

According to the present embodiment, as with Embodiment 1, the charge generating layer 9 is present in the red sub-pixel region 2R, the green sub-pixel region 2G, the blue sub-pixel region 2B, and the white sub-pixel region 2W. Thus, the charge generating layer 9 can be formed without using a precise shadow mask. Accordingly, manufacturing cost and productivity improvements can be made.

[13. Display Device]

Figure 17:
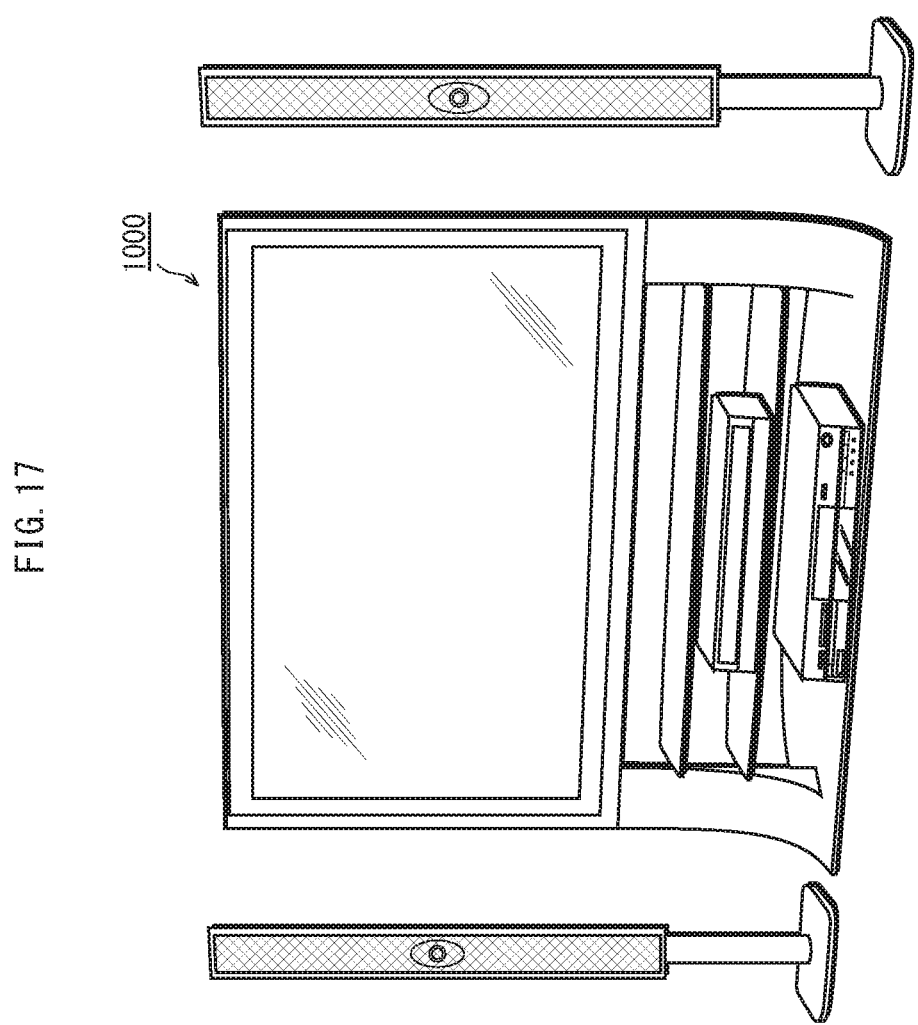
FIG. 17 is an external view of a display device.
Figure 18:
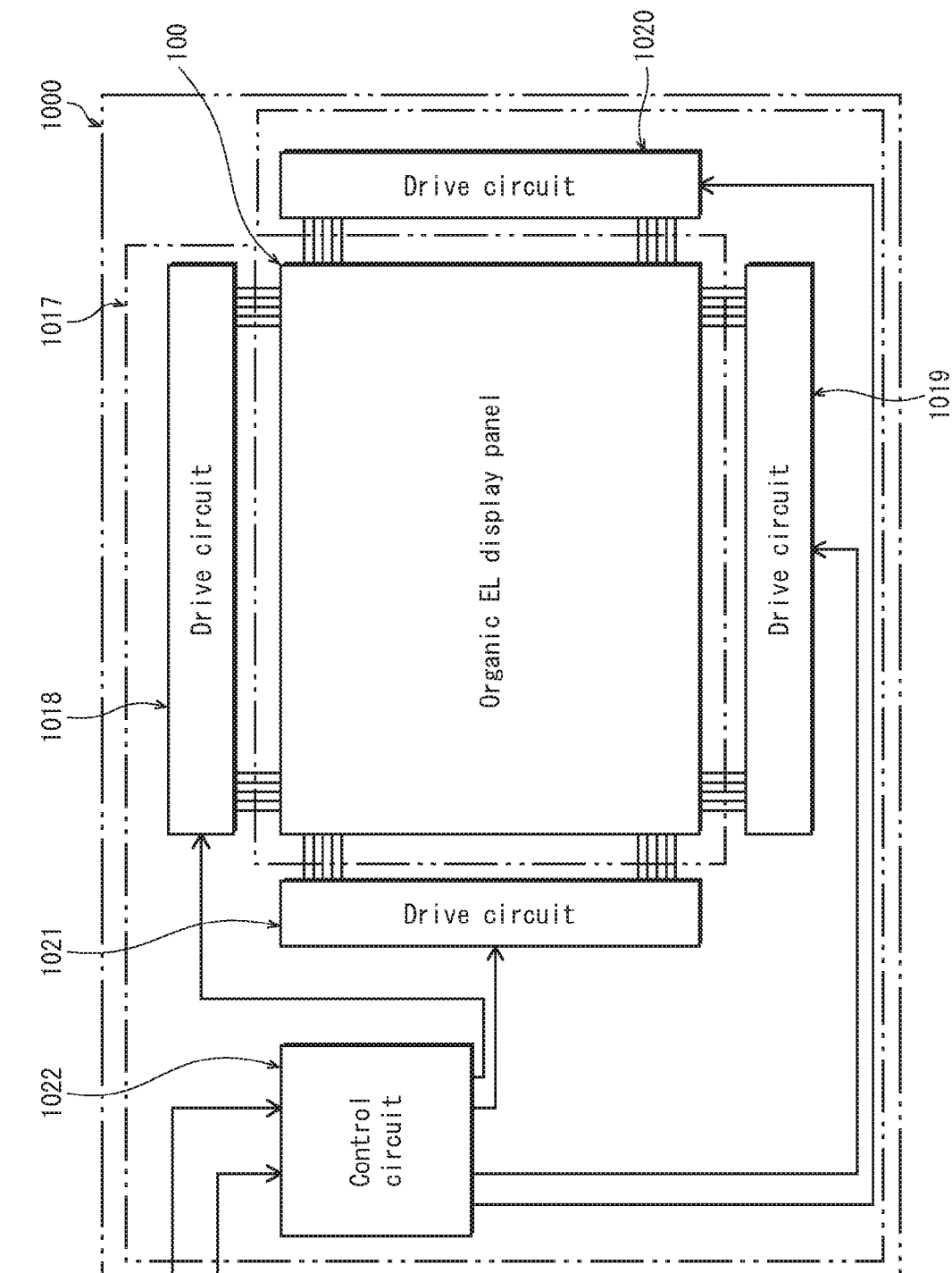
FIG. 18 is a block diagram illustrating internal elements of the display device.

The organic EL display panel described as Embodiment 1 and as Embodiment 2 can be used in a display device 1000 as illustrated in FIG. 17. As illustrated in FIG. 18, the display device 1000 includes an organic EL display panel 100 and a drive control circuit 1017. The organic EL display panel 100 is, for example, the organic EL display panel described as Embodiment 1. The drive control circuit 1017 includes drive circuits 1018, 1019, 1020, 1021 and a control circuit 1022. The control circuit 1022 receives a video signal from an external source, and converts the video signal to voltage signals appropriate to TFT drive circuits in the organic EL display panel 100. The drive circuits 1018, 1019, 1020, 1021 transmit the voltage signals received from the control circuit to the TFT drive circuits in the organic EL display panel 100.

INDUSTRIAL APPLICABILITY

The organic EL display panel pertaining to the present disclosure can be used, for example, in the home, in public facilities, or in businesses, and can be used in a variety of display devices, television devices, display devices for portable electronic devices, etc.

REFERENCE SIGNS LIST

1 first substrate
2 banks
3 insulating layer
4, 204 light-reflecting electrodes
5 first hole injection layers
6 first hole transport layers
7 first light-emitting layers
7R first red light-emitting layer
7G green light-emitting layer
7B first blue light-emitting layer
7W second red light-emitting layer
8 first electron transport layer
9 charge generating layer
10 second hole transport layer
11 second blue light-emitting layer
12 second electron transport layer
13, 213 light-transmissive electrodes
14 protective layer
15 color filter layer
15R red filter
15G green filter
15B blue filter
16 second substrate
17R first red light-emitting unit
17G first green light-emitting unit
17B first blue light-emitting unit
17W second red light-emitting unit
18B second blue light-emitting unit

The invention claimed is:

1. An organic electroluminescence (EL) display panel comprising:
 a substrate;
 a plurality of banks, disposed above the substrate, that define a red sub-pixel region, a green sub-pixel region, a blue sub-pixel region, and a white sub-pixel region;
 a plurality of light-reflective electrodes, disposed above the substrate in the red sub-pixel region, the green sub-pixel region, the blue sub-pixel region, and the white sub-pixel region, each of the light-reflective electrodes having a light-reflective surface;
 a first red light-emitting unit disposed above a first one of the light-reflective electrodes in the red sub-pixel region, the first red light-emitting unit including a first red light-emitting layer comprising a material that has an emission peak in a red wavelength band, the first red light-emitting layer having a light-emitting surface that faces the light-reflective surface of the first one of the light-reflective electrodes;
 a first green light-emitting unit disposed above a second one of the light-reflective electrodes in the green sub-pixel region, the first green light-emitting unit including a green light-emitting layer comprising a material that has an emission peak in a green wavelength band, the green light-emitting layer having a light-emitting surface that faces the light-reflective surface of the second one of the light-reflective electrodes;
 a first blue light-emitting unit disposed above a third one of the light-reflective electrodes in the blue sub-pixel region, the first blue light-emitting unit including a first blue light-emitting layer comprising a material that has an emission peak in a blue wavelength band, the first blue light-emitting layer having a light-emitting surface that faces the light-reflective surface of the third one of the light-reflective electrodes;
 a second red light-emitting unit disposed above a fourth one of the light-reflective electrodes in the white sub-pixel region, the second red light-emitting unit including a second red light-emitting layer comprising a material that has an emission peak in a red wavelength band, the second red light-emitting layer having a light-emitting surface that faces the light-reflective surface of the fourth one of the light-reflective electrodes;
a charge generating layer disposed above the first red light-emitting unit, the first green light-emitting unit, the first blue light-emitting unit, and the second red light-emitting unit in the red sub-pixel region, the green sub-pixel region, the blue sub-pixel region, and the white sub-pixel region;
a second blue light-emitting unit disposed above the charge generating layer in the red sub-pixel region, the green sub-pixel region, the blue sub-pixel region, and the white sub-pixel region, the second blue light-emitting unit including a second blue light-emitting layer comprising a material that has an emission peak in a blue wavelength band, the second blue light-emitting layer having light-emitting surfaces that each face corresponding ones of the light-reflective surfaces of the light-reflective electrodes;
a light-transmissive electrode disposed above the second blue light-emitting unit in the red, the green, the blue, and the white sub-pixel regions; and
a color filter layer that includes a red filter disposed above the first one of the light-reflective electrodes in the red sub-pixel region, a green filter disposed above the second one of the light-reflective electrodes in the green sub-pixel region, and a blue filter disposed above the third one of the light-reflective electrodes in the blue sub-pixel region, wherein
in the red sub-pixel region, an optical length between the light-emitting surface of the first red light-emitting layer and the light-reflective surface of the first one of the light-reflective electrodes is from 20 nm to 50 nm,
in the green sub-pixel region, an optical length between the light-emitting surface of the green light-emitting layer and the light-reflective surface of the second one of the light-reflective electrodes is from 20 nm to 50 nm,
in the blue sub-pixel region, an optical length between the light-emitting surface of the first blue light-emitting layer and the light-reflective surface of the third one of the light-reflective electrodes is from 20 nm to 60 nm,
in the white sub-pixel region, an optical length between the light-emitting surface of the second red light-emitting layer and the light-reflective surface of the fourth one of the light-reflective electrodes is from 20 nm to 50 nm,
in the red sub-pixel region, an optical length between one of the light-emitting surfaces of the second blue light-emitting layer and the light-reflective surface of the first one of the light-reflective electrodes is from 210 nm to 230 nm,
in the green sub-pixel region, an optical length between one of the light-emitting surfaces of the second blue light-emitting layer and the light-reflective surface of the second one of the light-reflective electrodes is from 240 nm to 295 nm,
in the blue sub-pixel region, an optical length between one of the light-emitting surfaces of the second blue light-emitting layer and the light-reflective surface of the third one of the light-reflective electrodes is from 195 nm to 205 nm, and
in the white sub-pixel region, an optical length between one of the light-emitting surfaces of the second blue light-emitting layer and the light-reflective surface of the fourth one of the light-reflective electrodes is from 210 nm to 230 nm.

2. The organic EL display panel of claim 1, wherein
in the white sub-pixel region, when light mixed from red light emitted from the second red light-emitting layer and blue light emitted from the second blue light-emitting layer is expressed in CIE chromaticity, an x value thereof is from 0.25 to 0.45, a y value thereof is from 0.25 to 0.45, and an absolute value of difference between the x value and the y value is from 0 to 0.05.

3. The organic EL display panel of claim 1, wherein
the optical length between one of the light-emitting surfaces of the second blue light-emitting layer and the light-reflective surface of the first one of the light-reflective electrodes in the red sub-pixel region is different from the optical length between one of the light-emitting surfaces of the second blue light-emitting layer and the light-reflective surface of the fourth one of the light-reflective electrodes in the white sub-pixel region.

4. The organic EL display panel of claim 1, wherein
the optical length between one of the light-emitting surfaces of the second blue light-emitting layer and the light-reflective surface of the first one of the light-reflective electrodes in the red sub-pixel region is the same as the optical length between one of the light-emitting surfaces of the second blue light-emitting layer and the light-reflective surface of the fourth one of the light-reflective electrodes in the white sub-pixel region.

5. The organic EL display panel of claim 1, wherein
at least one of the first red light-emitting layer, the green light-emitting layer, the first blue light-emitting layer, and the second red light-emitting layer includes high-molecular material.

6. The organic EL display panel of claim 1, wherein
the second blue light-emitting layer includes low-molecular material.

7. A display device comprising the organic EL display panel of claim 1, and drive control circuitry that drives the organic EL display panel.

8. A method of manufacturing the organic EL display panel of claim 1, the method comprising:
creating the first red light-emitting layer, the green light-emitting layer, the first blue light-emitting layer, and the second red light-emitting layer by using a wet process, and
creating the second blue light-emitting layer by using vacuum deposition or sputtering.

9. An organic electroluminescence (EL) display panel comprising:
a substrate;
a plurality of banks, disposed above the substrate, that define a red sub-pixel region, a green sub-pixel region, a blue sub-pixel region, and a white sub-pixel region;
a plurality of light-transmissive electrodes, disposed above the substrate in the red sub-pixel region, the green sub-pixel region, the blue sub-pixel region, and the white sub-pixel region;
a first red light-emitting unit disposed above a first one of the light-transmissive electrodes in the red sub-pixel region, the first red light-emitting unit including a first red light-emitting layer comprising a material that has an emission peak in a red wavelength region, the red light-emitting layer having a light-emitting surface that faces the first one of the light-transmissive electrodes;
a first green light-emitting unit disposed above a second one of the light-transmissive electrodes in the green sub-pixel region, the first green light-emitting unit including a green light-emitting layer comprising a material that has an emission peak in a green wavelength region, the green light-emitting layer having a light-emitting surface that faces the second one of the light-transmissive electrodes;
a first blue light-emitting unit disposed above a third one of the light-transmissive electrodes in the blue sub-pixel region, the first blue light-emitting unit including a first blue light-emitting layer comprising a material that has an emission peak in a blue wavelength region, the first blue light-emitting layer having a light-emitting surface that faces the third one of the light-transmissive electrodes;
a second red light-emitting unit disposed above a fourth one of the light-transmissive electrodes in the white sub-pixel region, the second red light-emitting unit including a second red light-emitting layer comprising a material that has an emission peak in a red wavelength region, the second red light-emitting layer having a light-emitting surface that faces the fourth one of the light-transmissive electrodes;
a charge generating layer disposed above the first red light-emitting unit, the first green light-emitting unit, the first blue light-emitting unit, and the second red light-emitting unit in the red sub-pixel region, the green sub-pixel region, the blue sub-pixel region, and the white sub-pixel region;
a second blue light-emitting unit disposed above the charge generating layer in the red sub-pixel region, the green sub-pixel region, the blue sub-pixel region, and the white sub-pixel region, the second blue light-emitting unit including a second blue light-emitting layer comprising a material that has an emission peak in a blue wavelength region, the second blue light-emitting layer having light-emitting surfaces that each face corresponding ones of the light-transmissive electrodes;
a light-reflective electrode disposed above the second blue light-emitting unit in the red sub-pixel region, the green sub-pixel region, the blue sub-pixel region, and the white sub-pixel region, the light-reflective electrode having a plurality of light-reflecting surfaces, and
a color filter layer that includes a red filter disposed below the first one of the light-transmissive electrodes in the red sub-pixel region, a green filter disposed below the second one of the light-transmissive electrodes in the green sub-pixel region, and a blue filter disposed below the third one of the light-transmissive electrodes in the blue sub-pixel region, wherein
in the red sub-pixel region, an optical length between the light-emitting surface of the first red light-emitting layer and a corresponding one of the light-reflective surfaces of the light-reflective electrode is from 255 nm to 300 nm,
in the green sub-pixel region, an optical length between the light-emitting surface of the green light-emitting layer and a corresponding one of the light-reflective surfaces of the light-reflective electrode is from 250 nm to 300 nm,
in the blue sub-pixel region, an optical length between the light-emitting surface of the first blue light-emitting layer and a corresponding one of the light-reflective surfaces of the light-reflective electrode is from 210 nm to 220 nm,
in the white sub-pixel region, an optical length between the light-emitting surface of the second red light-emitting layer and a corresponding one of the light-reflective surfaces of the light-reflective electrode is from 255 nm to 270 nm, and
in the red sub-pixel region, the green sub-pixel region, the blue sub-pixel region, and the white sub-pixel region, each optical length between the light-emitting surfaces of the second blue light-emitting layer and corresponding ones of the light-reflective surfaces of the light-reflective electrode is from 60 nm to 75 nm.

10. The organic EL display panel of claim 9, wherein
in the white sub-pixel region, when light mixed from red light emitted from the second red light-emitting layer and blue light emitted from the second blue light-emitting layer is expressed in CIE chromaticity, an x value thereof is from 0.25 to 0.45, a y value thereof is from 0.25 to 0.45, and an absolute value of difference between the x value and the y value is from 0 to 0.05.

11. The organic EL display panel of claim 9, wherein
the optical length between the light-emitting surface of the first red light-emitting layer and the corresponding one of the light-reflective surfaces of the light-reflective electrode in the red sub-pixel region is different from the optical length between the light-emitting surface of the second red light-emitting layer and the corresponding one of the light-reflective surfaces of the light-reflective electrode in the white sub-pixel region.

12. The organic EL display panel of claim 9, wherein
the optical length between the light-emitting surface of the first red light-emitting layer and the corresponding one of the light-reflective surfaces of the light-reflective electrode in the red sub-pixel region is the same as the optical length between the light-emitting surface of the second red light-emitting layer and the corresponding one of the light-reflective surfaces of the light-reflective electrode in the white sub-pixel region.

13. The organic EL display panel of claim 9, wherein
at least one of the first red light-emitting layer, the green light-emitting layer, the first blue light-emitting layer, and the second red light-emitting layer includes high-molecular material.

14. The organic EL display panel of claim 9, wherein
the second blue light-emitting layer includes low-molecular material.

* * * * *